(12) United States Patent  
Hosokawa

(10) Patent No.: US 8,009,418 B2  
(45) Date of Patent: Aug. 30, 2011

(54) INFORMATION PROCESSING APPARATUS

(75) Inventor: Daisuke Hosokawa, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 215 days.

(21) Appl. No.: 12/474,095

(22) Filed: May 28, 2009

(65) Prior Publication Data

US 2009/0323277 A1 Dec. 31, 2009

(30) Foreign Application Priority Data

Jun. 30, 2008 (JP) ................................. 2008-171487

(51) Int. Cl.
*H05K 7/20* (2006.01)

(52) U.S. Cl. ......... 361/679.52; 361/679.47; 361/679.54; 361/718; 361/719; 700/300

(58) Field of Classification Search ............. 361/679.52, 361/679.47, 679.54, 718, 719; 700/300
See application file for complete search history.

(56) References Cited

U.S. PATENT DOCUMENTS

| | | | | |
|---|---|---|---|---|
| 5,796,580 | A * | 8/1998 | Komatsu et al. | 361/679.48 |
| 6,226,178 | B1 * | 5/2001 | Broder et al. | 361/679.52 |
| 6,283,379 | B1 * | 9/2001 | Kazmierowicz et al. | 236/15 BC |
| 6,742,583 | B2 * | 6/2004 | Tikka | 165/291 |
| 6,798,660 | B2 * | 9/2004 | Moss et al. | 361/699 |
| 6,859,882 | B2 * | 2/2005 | Fung | 713/300 |
| 6,876,549 | B2 * | 4/2005 | Beitelmal et al. | 361/692 |
| 7,134,607 | B2 * | 11/2006 | Ozawa et al. | 236/49.3 |
| 7,372,698 | B1 * | 5/2008 | Tilton et al. | 361/701 |
| 7,707,436 | B2 | 4/2010 | Tsukamoto | |
| 7,826,215 | B2 * | 11/2010 | Glover et al. | 361/679.49 |
| 7,826,216 | B2 * | 11/2010 | Moss | 361/679.49 |
| 7,925,902 | B1 * | 4/2011 | Radcliffe et al. | 713/300 |
| 2002/0147564 | A1 * | 10/2002 | Lamb et al. | 702/132 |
| 2006/0139326 | A1 | 6/2006 | Tsukamoto | |
| 2007/0230123 | A1 * | 10/2007 | Hata et al. | 361/695 |
| 2008/0036076 | A1 * | 2/2008 | Ouyang | 257/714 |
| 2008/0055848 | A1 * | 3/2008 | Hamburgen et al. | 361/691 |

(Continued)

FOREIGN PATENT DOCUMENTS

JP 3-134442 6/1991

(Continued)

OTHER PUBLICATIONS

Japanese Patent Application No. 2008-171487, Decision of Rejection, mailed Jun. 15, 2010 (English Translation).

(Continued)

*Primary Examiner* — Anatoly Vortman  
(74) *Attorney, Agent, or Firm* — Blakely, Sokoloff, Taylor & Zafman LLP

(57) ABSTRACT

According to one embodiment, an information processing apparatus includes a heating device, a heat radiation module, a first temperature sensor configured to detect a temperature at a first position on a printed circuit board, a second temperature sensor configured to detect a temperature at a second position on the printed circuit board, which is farther from the heating device than the first position, a temperature difference detection module configured to detect a temperature difference which is obtained by subtracting the temperature at the second position from the temperature at the first position, and a performance determination module configured to execute a monitoring process of monitoring the temperature difference between the temperature at the first position and the temperature at the second position, and to determine whether a performance of the heat radiation module has lowered or not.

7 Claims, 15 Drawing Sheets

U.S. PATENT DOCUMENTS

2008/0086282 A1* 4/2008 Artman et al. ............... 702/136
2008/0158818 A1* 7/2008 Clidaras et al. ............... 361/699

FOREIGN PATENT DOCUMENTS

| | | |
|---|---|---|
| JP | 7-156511 | 6/1995 |
| JP | 2002-357317 | 12/2002 |
| JP | 2003-307194 | 10/2003 |
| JP | 2005-215794 | 8/2005 |
| JP | 2006-127283 | 5/2006 |
| JP | 2006-163459 | 6/2006 |
| JP | 2007-233782 | 9/2007 |
| JP | 2008-034715 | 2/2008 |
| JP | 2008-084010 | 4/2008 |
| JP | 2008-084173 | 4/2008 |
| JP | 2008-136911 | 6/2008 |

OTHER PUBLICATIONS

Japanese Patent Application No. 2008-171487, Notification of Reasons for Rejection, mailed Mar. 16, 2010. (English Translation).
Japanese Patent Application No. 2008-171487, Notification of Reasons for Rejection, mailed Oct. 20, 2009, (English Translation).

* cited by examiner

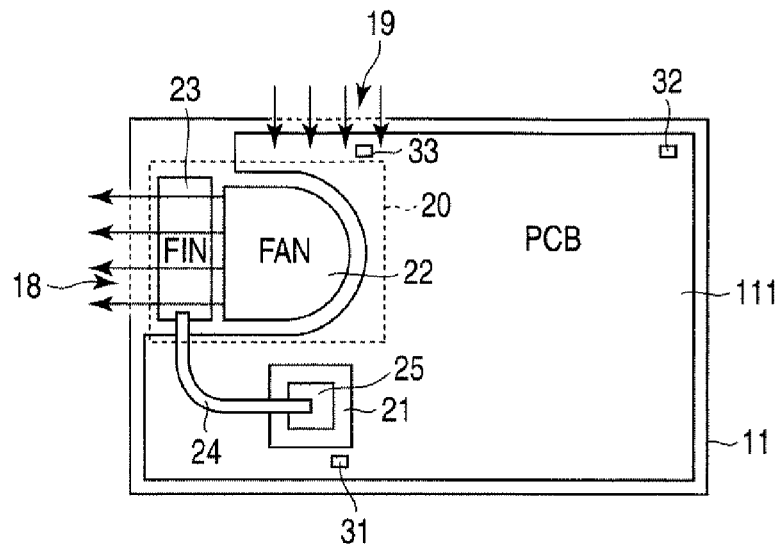
F I G. 2
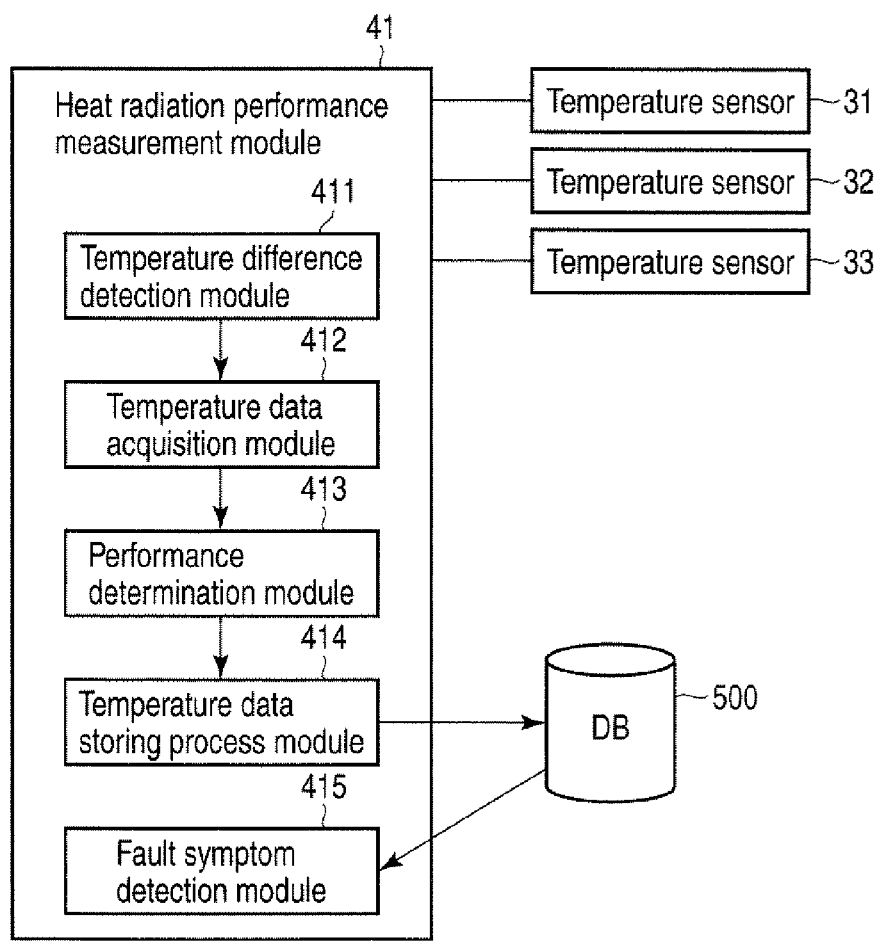
F I G. 3

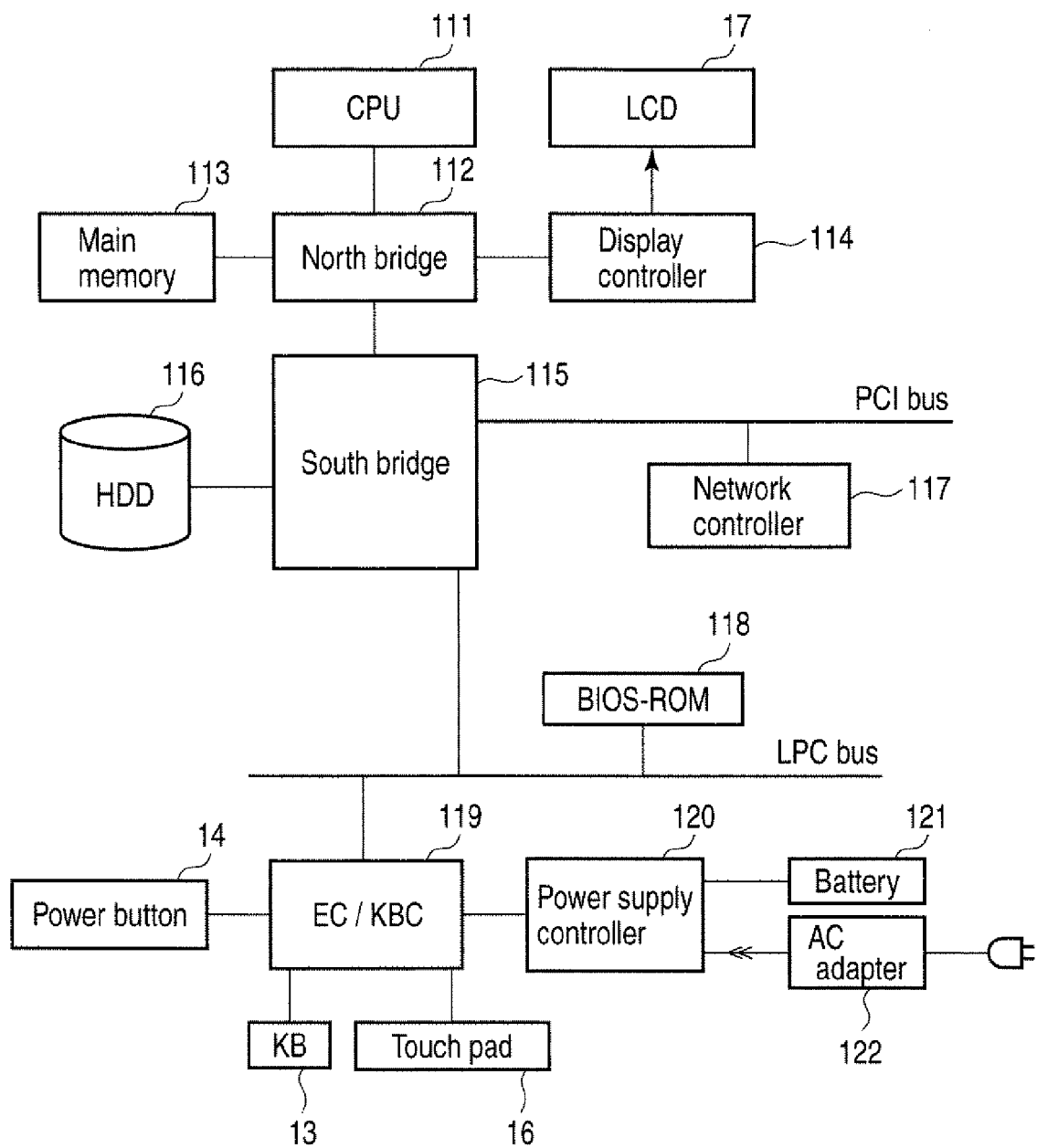
F I G. 6

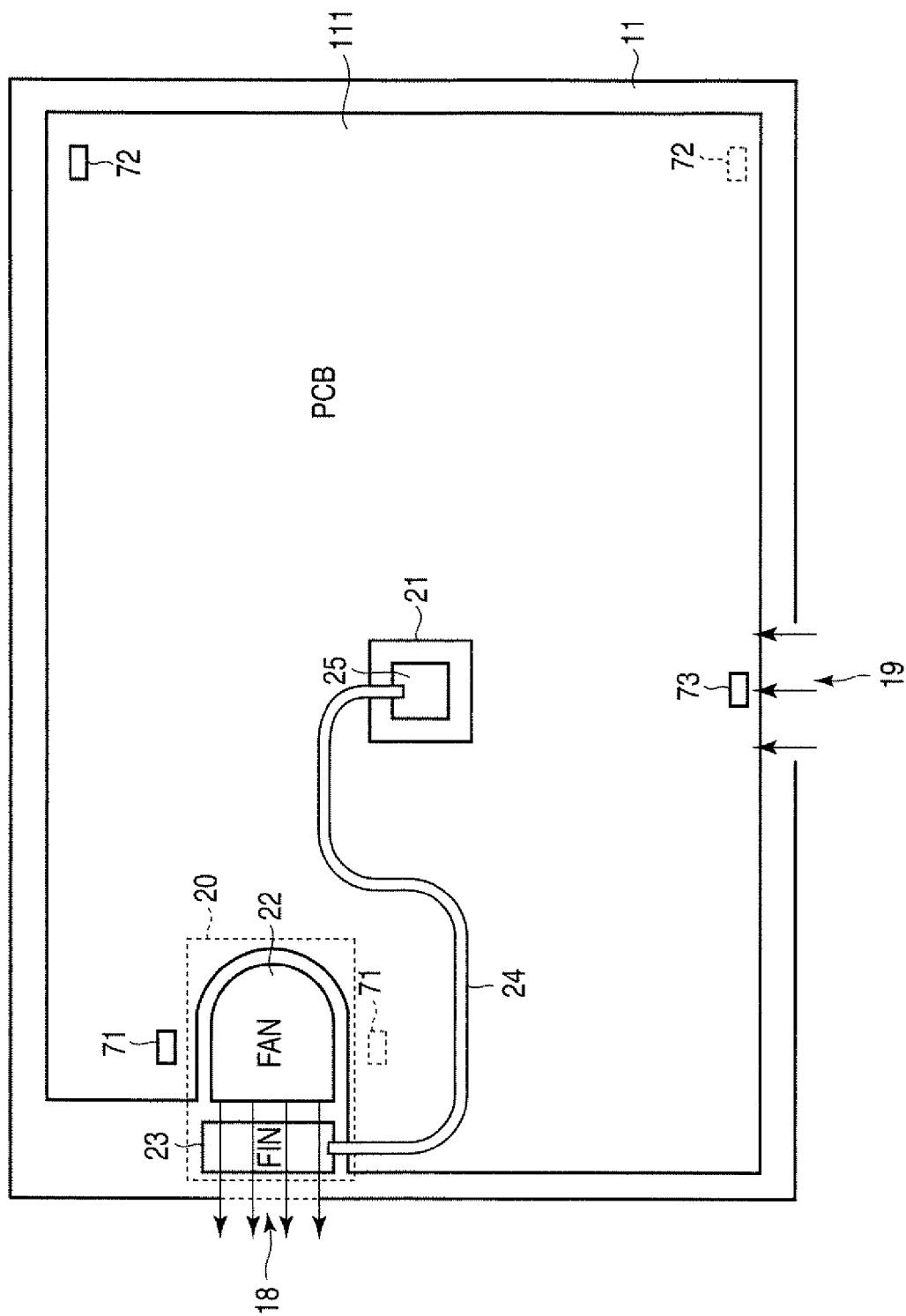
F I G. 14

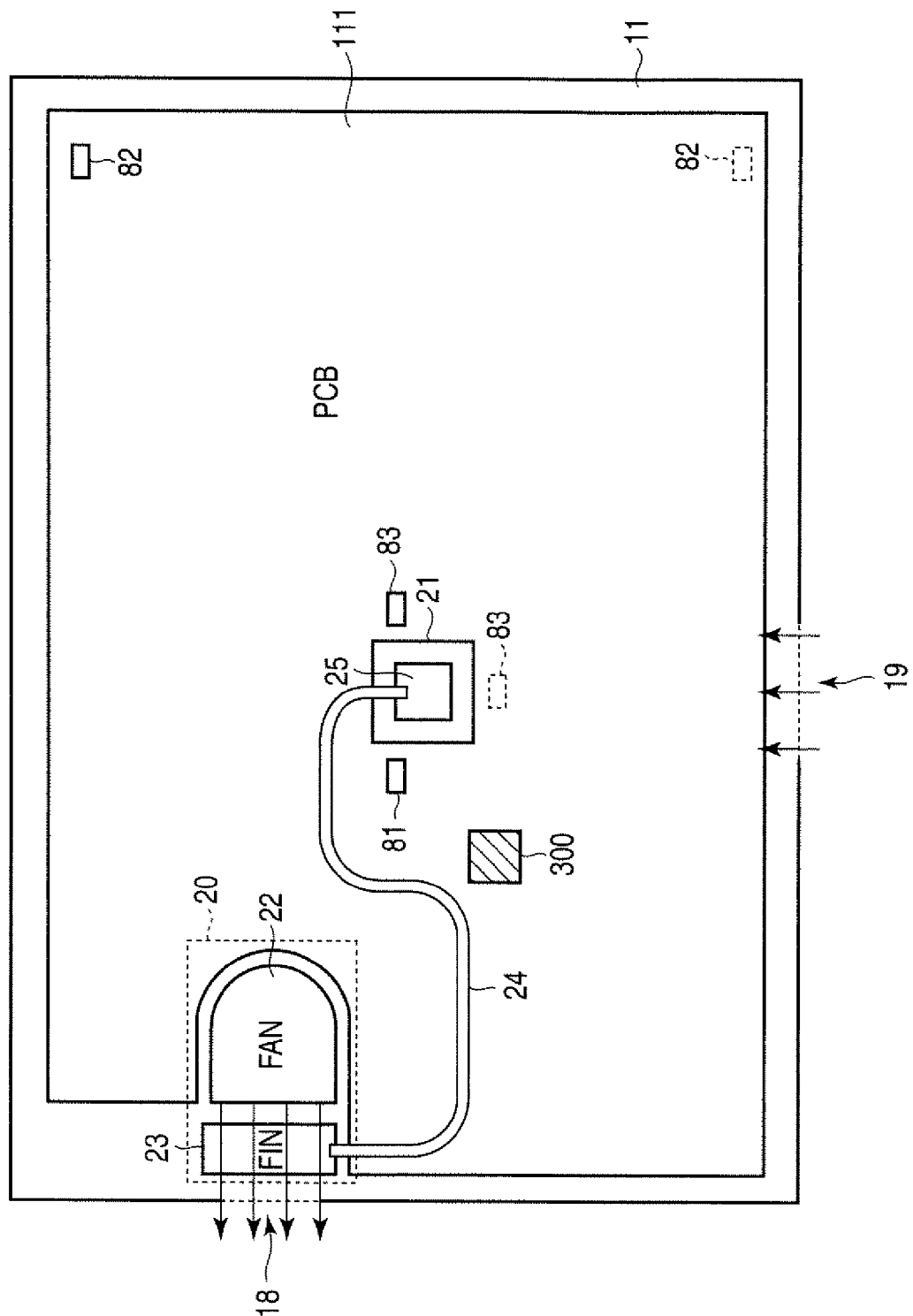
F I G. 18

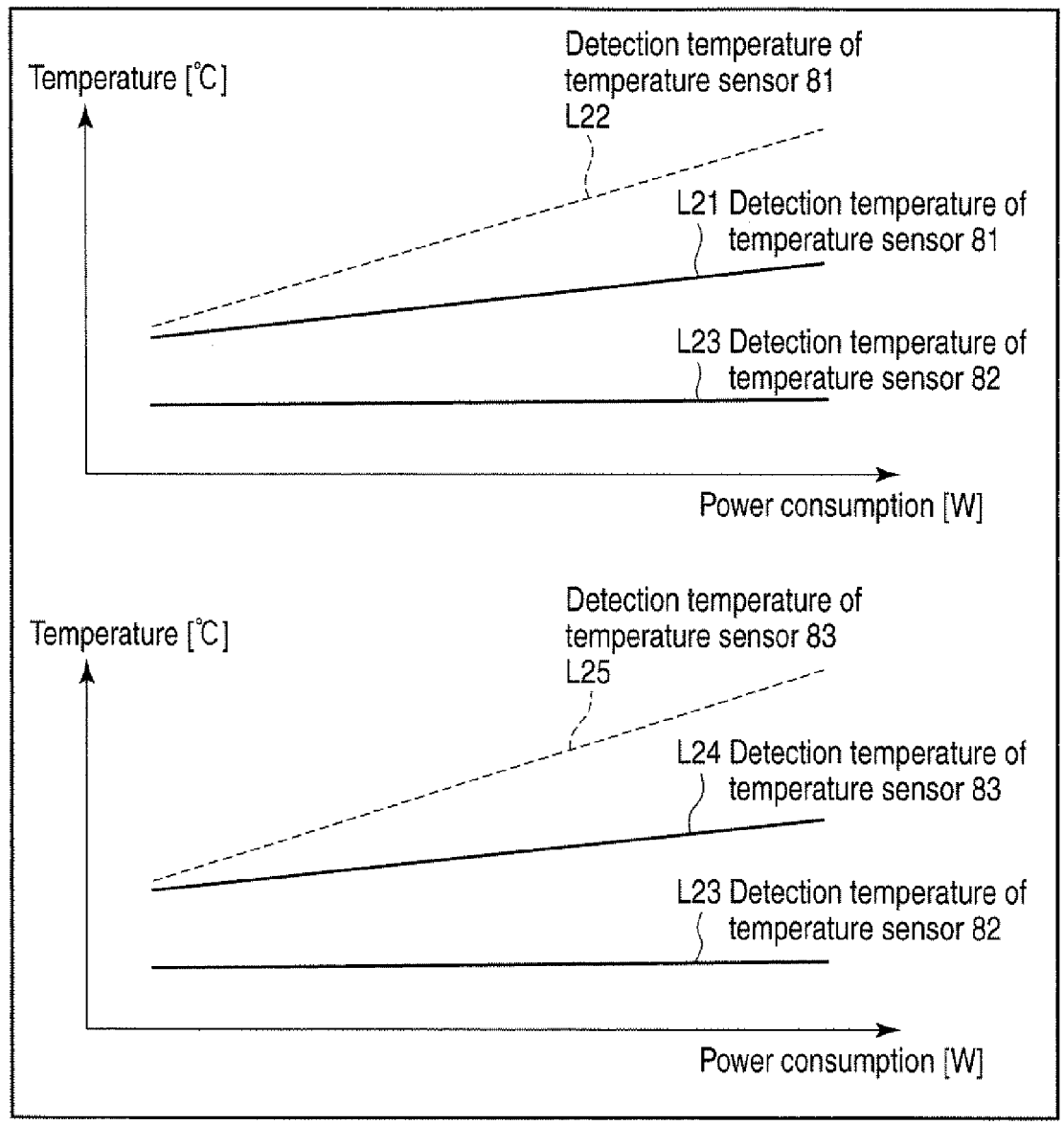
F I G. 1 9

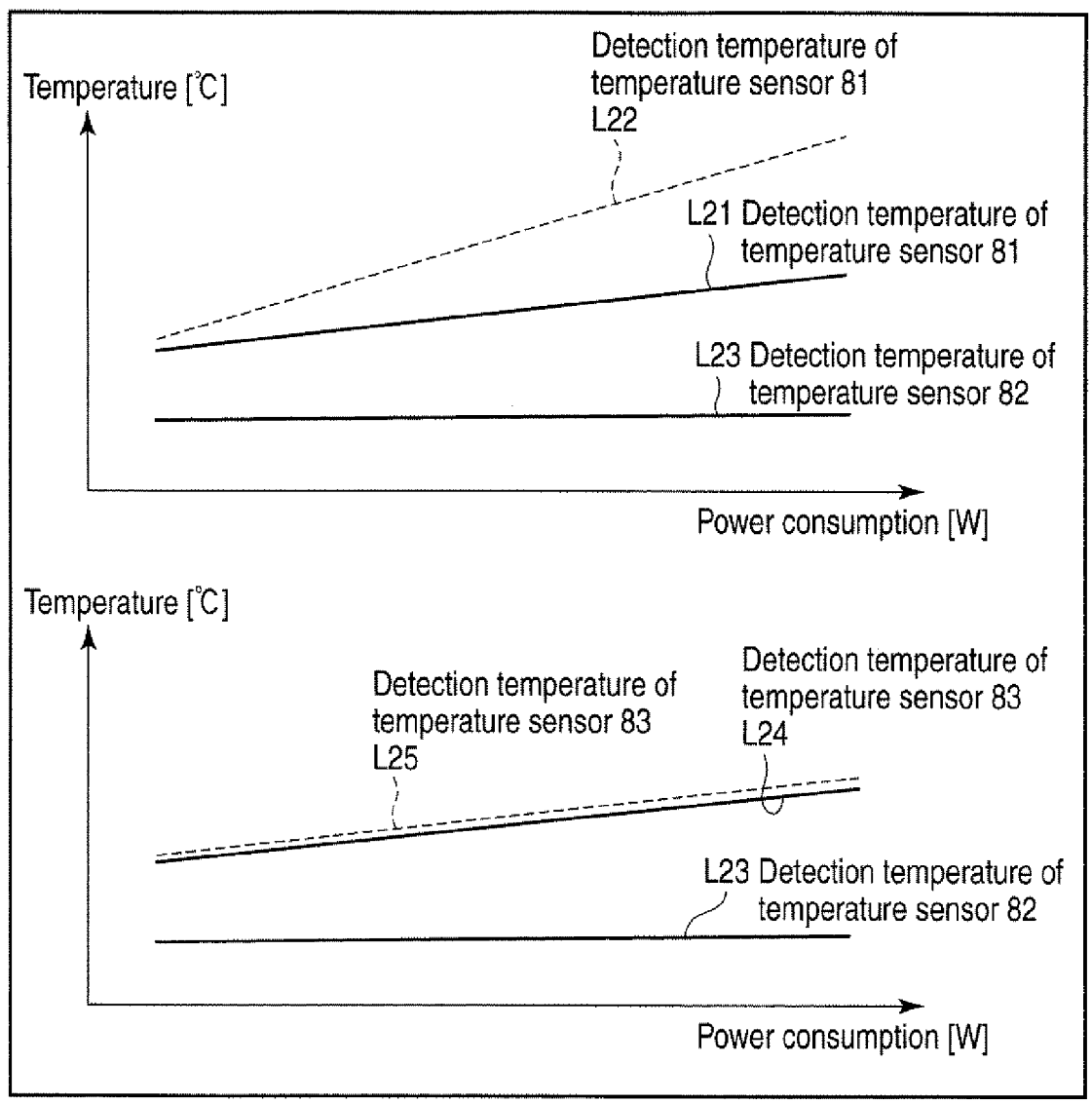
F I G. 2 0

INFORMATION PROCESSING APPARATUS

CROSS-REFERENCE TO RELATED APPLICATIONS

This application is based upon and claims the benefit of priority from Japanese Patent Application No. 2008-171487, filed Jun. 30, 2008, the entire contents of which are incorporated herein by reference.

BACKGROUND

1. Field

One embodiment of the invention relates generally to an information processing apparatus such as a personal computer, and more particularly to an information processing apparatus including a heat radiation module.

2. Description of the Related Art

In recent years, portable personal computers of various types, such as a laptop type and a notebook type, have been developed. This type of computer includes heating devices such as a CPU, a display controller, a hard disk drive and a bus bridge device.

As a cooling mechanism for cooling the heating devices, there is known a heat radiation module which makes use of, e.g. a fan and a heat radiation fin (heat sink).

Jpn. Pat. Appln. KOKAI Publication No. 2002-357317 discloses a power supply apparatus having a function of detecting clogging of an air inlet/outlet port. In this power supply apparatus, when a difference between an outside temperature and a temperature in the power supply apparatus exceeds a predetermined range, it is detected that abnormality has occurred at the air inlet/outlet port of the power supply apparatus, and a process of turning off the apparatus is executed.

In the meantime, the load of the information processing apparatus, such as a computer, varies greatly depending on the content of a process that is to be executed. In accordance with the variation of the load, the temperature in the vicinity of the heating device varies. For example, in the case where the load on the computer rises instantaneously, the heat, which surpasses the heat radiation performance of the heat radiation module, is produced from the heating device, and thereby the temperature in the vicinity of the heating device temporarily rises. Subsequently, the dissipation of the heat by the heat radiation module progresses and the temperature in the vicinity of the heating device gradually falls within a certain temperature range. In this manner, the temperature in the vicinity of the heating device varies in accordance with the variation of the load.

Thus, if the presence/absence of the decrease in performance of the heat radiation module is simply determined on the basis of only the result of comparison between the temperature outside the computer and the temperature within the computer, it would be possible that a temporary increase in load is erroneously determined as a decrease in performance of the heat radiation module.

In addition, in usual cases, in order to measure the performance of the heat radiation module, the user is required to perform an operation for starting a purpose-specific checking program for the performance measurement of the heat radiation module.

In this case, although the performance of the heat radiation module can be measured during a specific period in which the checking program is being executed, it is not possible to measure the performance of the heat radiation module in an ordinary operation state of the computer, in which the checking program is not executed. It is necessary, therefore, to realize a novel function for precisely detecting the performance of the heat radiation module.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 2 is an exemplary block diagram for describing a cooling mechanism which is mounted in the information processing apparatus according to the first embodiment;

FIG. 3 is an exemplary block diagram showing the structure of a heat radiation performance measurement module which is provided in the information processing apparatus according to the first embodiment;

FIG. 6 is an exemplary block diagram showing the system configuration of the information processing apparatus according to the first embodiment;

FIG. 14 shows an example of the arrangement of a cooling mechanism and first to third temperature sensors, which are mounted in an information processing apparatus according to a second embodiment of the invention;

FIG. 18 shows an example of the arrangement of a cooling mechanism and first to third temperature sensors, which are mounted in an information processing apparatus according to a third embodiment of the invention;

FIG. 19 is an exemplary view for explaining variation characteristics of temperatures which are detected by the first to third temperature sensors shown in FIG. 18;

FIG. 20 is an exemplary view for explaining variation characteristics of temperatures which are detected by the first to third temperature sensors shown in FIG. 18.

DETAILED DESCRIPTION

Various embodiments according to the invention will be described hereinafter with reference to the accompanying drawings. In general, according to one embodiment of the invention, there is provided an information processing apparatus comprising a housing, a printed circuit board provided in the housing, a heating device disposed on the printed circuit board, a heat radiation module provided in the housing, a first temperature sensor, a second temperature sensor, a temperature difference detection module, and a performance determination module. The heat radiation module is configured to exhaust heat of the heating device to outside. The first temperature sensor is configured to detect a temperature at a first position on the printed circuit board. The second temperature sensor is configured to detect a temperature at a second position on the printed circuit board, which is farther from the heating device than the first position. The temperature difference detection module is configured to detect a temperature difference which is obtained by subtracting the temperature at the second position detected by the second temperature sensor from the temperature at the first position detected by the first temperature sensor. The performance determination module is configured to be activated when the detected temperature difference exceeds a threshold value, to execute a monitoring process of monitoring the temperature difference between the temperature at the first position and the temperature at the second position during a predetermined period from a time point when the detected temperature difference exceeds the threshold value, and to determine, based on a result of the monitoring process, whether a performance of the heat radiation module has lowered or not.

First Embodiment

Figure 1:
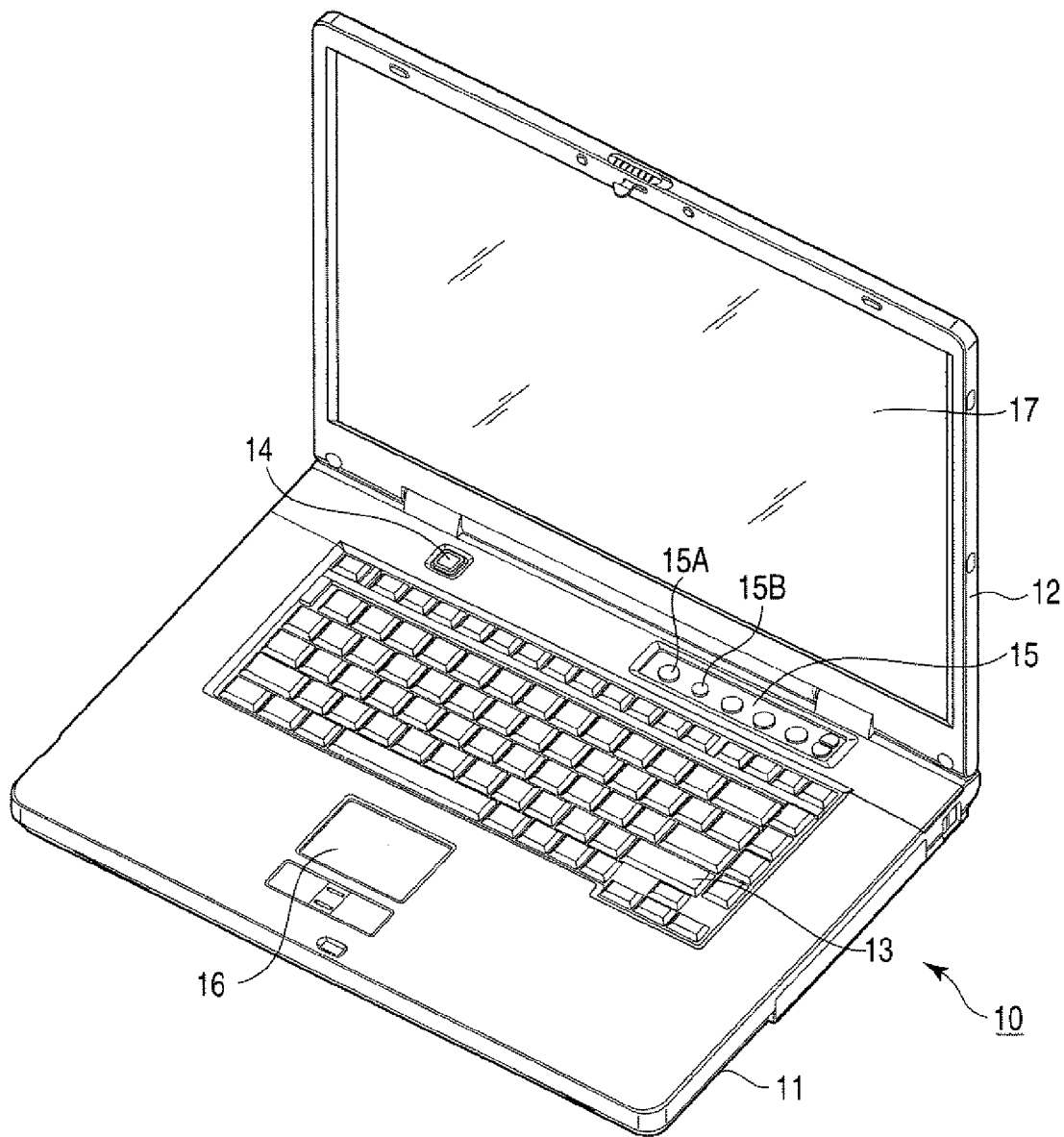
FIG. 1 is an exemplary perspective view showing a front-side external appearance of an information processing apparatus according to a first embodiment of the invention.

To begin with, referring to FIG. 1, the structure of an information processing apparatus according to a first embodiment of the present invention is described. The information processing apparatus is realized, for example, as a battery-powerable portable notebook personal computer 10.

FIG. 1 is a perspective view showing, from the front side, the computer 10 in the state in which a display unit of the computer 10 is opened.

The computer 10 comprises a housing 11 as a computer main body, and a display unit 12. A display device that is composed of an LCD (Liquid Crystal Display) 17 is built in the display unit 12. The display screen of the LCD 17 is positioned at an approximately central part of the display unit 12.

The display unit 12 is supported on the housing 11 and is attached to the housing 11 such that the display unit 12 is freely rotatable between an open position where the top surface of the housing 11 is exposed and a closed position where the top surface of the housing 11 is covered by the display unit 12. A printed circuit board is provided in the housing 11. Various heating devices, such as a CPU, a display controller, a hard disk drive and a bus bridge device, are mounted on the printed circuit board.

A keyboard 13, a power button 14 for powering on/off the computer 10, an input operation panel 15 and a touch pad 16 are disposed on the top surface of the housing 11.

The input operation panel 15 is an input device which inputs an event corresponding to a pressed button. The input operation panel 15 has a plurality of buttons for activating a plurality of functions. The buttons include buttons 15A and 15B for activating specific application programs.

FIG. 2 shows an example of a cooling mechanism which is provided in the housing 11. As shown in FIG. 2, a heat radiation module 20, a heating device 21, and temperature sensors 31, 32 and 33 are provided in the housing 11.

The heating device 21 is a device such as a central processing unit (CPU), a display controller, a hard disk drive or a bus bridge device. The heating device 21 is disposed on a printed circuit board (PCB) 111 which is provided in the housing 11. The printed circuit board 111 is a so-called motherboard on which various electronic components constituting the computer 10 are mounted.

The heat radiation module 20 radiates the heat of the heating device 21, which is an object of cooling, to the outside.

The heat radiation module 20 is composed of, for instance, a fan 22 and a heat radiation fin (also referred to as "heat sink") 23. An air outlet port (air outlet opening) 18 is provided in one side wall of the housing 11. In addition, an air inlet port (air inlet opening) 19 is provided, for example, in another side wall of the housing 11. The heat radiation fin 23 is provided within the housing 11 at such a position that the heat radiation fin 23 is opposed to the air outlet port 18. Specifically, the heat radiation fin 23 is provided near the air outlet port 18 in such a fashion that the heat radiation fin 23 is opposed to the air outlet port 18. The heat radiation fin 23 is thermally connected to the heating device 21 via a heat-receiving module, etc. To be more specific, the heat radiation fin 23 is thermally connected to the heating device 21 via a heat pipe 24 and a heat-receiving module 25.

The fan 22 is a cooling fan for cooling the heat radiation fin 23. The fan 22 is disposed near the heat radiation fin 23. The fan 22 cools by air the heat radiation fin 23 that is thermally connected to the heating device 21, thereby exhausting the heat of the heating device 21 to the outside via the air outlet port 18.

The temperature sensors 31 to 33 are provided on the printed circuit board 111. Each of the temperature sensors 31 to 33 is composed of, for instance, a thermistor or a dedicated temperature sensor IC, which is attached on the printed circuit board 111.

The temperature sensor 31 is used in order to detect the ambient temperature of the heating device 21. Specifically, the temperature sensor 31 functions as a first temperature sensor which detects the temperature at a first position on the printed circuit board 111, which is close to the heating device 21 (i.e. the board temperature near the heating device 21). The temperature sensor 31 is provided at the first position on the printed circuit board 111, which is close to the heating device 21, and is used in order to monitor the effect of the board temperature due to the heat production of the heating device 21. In case abnormality has occurred in the heat radiation module 20, the amount of heat that is conducted from the heating device 21 to the heat radiation module 20 decreases. As a result, the heat of the heating device 21 transfers to the printed circuit board 111, and the temperature at the first position on the printed circuit board 111, which is close to the heating device 21, rises. The temperature at the first position on the printed circuit board 111 is detected by the temperature sensor 31. In short, the temperature sensor 31 functions as the sensor for detecting the temperature rise due to abnormality of the heat radiation module 20.

The temperature sensor 32 functions as a second temperature sensor which detects the temperature at a second position on the printed circuit board 111, which is farther from the heating device 21 than the first position (i.e. the intra-housing temperature). Specifically, the temperature sensor 32 is disposed at an end portion on the board 111, which is hardly affected by the heat that is produced by the heating device 21. The heating device 21 is disposed at a position which is shifted from the central position toward one side wall within the housing 11. In this case, the temperature sensor 32 may be disposed at a position which is shifted toward another side wall that is opposed to said one side wall. As shown in FIG. 2, in the case where the heating device 21 is disposed at one corner portion within the housing 11, the temperature sensor 32 may be disposed at another corner portion which is diagonally away from said one corner portion.

The temperature at the second position on the printed circuit board 111, which is detected by the temperature sensor 32, is used as a reference temperature for evaluating the temperature at the first position on the printed circuit board 111 (the board temperature near the heating device 21) which is detected by the temperature sensor 31.

The temperature sensor 33 is provided at a third position on the board 111, which is located between the air inlet port 19 provided in the housing 11 and the heat radiation module 20. The temperature sensor 33 is used as a third temperature sensor which detects the temperature at the third position on the board 111, that is, the temperature of the air (cooling air) flowing from the air inlet port 19 toward the heat radiation module 20. For example, as shown in FIG. 2, the temperature sensor 33 is provided at a position on the opposite side to the heating device 21, with the heat radiation module 20 being interposed between the temperature sensor 33 and the heating device 21. Thereby, the temperature sensor 33 can precisely detect the temperature of the incoming air (cooling air) from the outside, without being influenced by the heat of the heating device 21.

Next, referring to FIG. 3, a description is given of the structure of a heat radiation performance measurement module 41 which is provided in the computer 10.

The heat radiation performance measurement module 41 is provided within the housing 11. The heat radiation performance measurement module 41 measures the performance of the heat radiation module 20 by using the temperature sensors 31, 32 and 33, or by using only the temperature sensors 31 and 32.

The heat radiation performance measurement module 41 includes a temperature difference detection module 411, a temperature data acquisition module 412, a performance determination module 413, a temperature data storing process module 414 and a fault symptom detection module 415.

The temperature difference detection module 411 detects a temperature difference (T1−Tref) which is obtained by subtracting the temperature (Tref), which is detected by the temperature sensor 32, from the temperature (T1) which is detected by the temperature sensor 31.

The performance determination module 413 is activated when the temperature difference (T1−Tref), which is detected by the temperature difference detection module 411, exceeds a certain specific threshold value TH1. The performance determination module 413 continuously executes, during a predetermined time period from the time point when the temperature difference (T1−Tref) exceeds the threshold value TH1, a monitoring process of monitoring the temperature difference (T1−Tref) between the temperature (T1) that is detected by the temperature sensor 31 and the temperature (Tref) that is detected by the temperature sensor 32. On the basis of the result of this monitoring process, the performance determination module 413 determines whether the performance of the heat radiation module 20 has lowered or not. In the monitoring process, it may be possible to monitor not only the temperature difference (T1−Tref) between the temperature (T1) that is detected by the temperature sensor 31 and the temperature (Tref) that is detected by the temperature sensor 32, but also a temperature difference (T2−Tref) between the temperature (T2) of the cooling air and the temperature (Tref) in the housing 11. Thereby, it becomes possible to detect not only the presence/absence of the decrease in performance of the heat radiation module 20, but also the occurrence of a fault, such as clogging, of the air inlet port 19.

In the monitoring process, the performance determination module 413 executes an acquisition process of acquiring, via the temperature data acquisition module 412, a pair of a first temperature sample value that is indicative of the board temperature near the heating device 21, which is detected by the temperature sensor 31, and a second temperature sample value that is indicative of the intra-housing temperature which is detected by the temperature sensor 32. This acquisition process is repeatedly executed at predetermined time intervals (e.g. in every 3 seconds) during a predetermined time period. On the basis of the pairs obtained during the predetermined time period, the performance determination module 413 determines whether the performance of the heat radiation module 20 has lowered or not. In this case, it can be determined whether the performance of the heat radiation module 20 has lowered or not, on the basis of the number of pairs in which a difference that is obtained by subtracting the second temperature sample value from the first temperature sample value exceeds a reference value K.

Specifically, the performance determination module 413 calculates a difference (T1−Tref) between the first temperature sample value (T1) and the second temperature sample value (Tref) with respect to each of the pairs acquired during the predetermined time period, and calculates the number of pairs which meet the condition that the difference (T1−Tref) exceeds the reference value K. In the case where the number of pairs, which meet the condition that the difference (T1−Tref) exceeds the reference value K, is greater than a reference number in the pairs acquired during the predetermined time period, the performance determination unit 413 determines that the performance of the heat radiation module 20 has lowered. As the reference value K, a value higher than the threshold value TH1 can be used.

In the above-described acquisition process, the acquisition process may be executed on condition that the temperature difference (T1−Tref) exceeds the threshold value TH1. In this case, the performance determination module 413 determines, at a sampling timing of every three seconds, whether the temperature difference (T1−Tref) exceeds the threshold value TH1. In the case where the temperature difference (T1−Tref) exceeds the threshold value TH1, the performance determination module 413 executes the acquisition process of acquiring a pair of the first temperature sample value that is indicative of the board temperature near the heating device 21, which is detected by the temperature sensor 31, and the second temperature sample value that is indicative of the intra-housing temperature which is detected by the temperature sensor 32. On the other hand, in the case where the temperature difference (T1−Tref) does not exceed the threshold value TH1, the performance determination module 413 skips the execution of the acquisition process, and stands by until the coming of the next sampling timing. The performance determination module 413 determines whether the performance of the heat radiation module 20 has lowered or not, according to whether a predetermined number of pairs have been acquired during a predetermined time period. For example, if a predetermined number of pairs have been acquired during a predetermined time period, the lowering of the performance of the heat radiation module 20 is determined.

Instead of determining the presence/absence of the lowering of the performance of the heat radiation module 20 according to whether a predetermined number of pairs have been acquired during a predetermined time period, it is possible to further analyze the predetermined number of pairs that have been acquired during the predetermined time period. Specifically, in the case where a predetermined number of pairs have been acquired during a predetermined time period, the performance determination module 413 calculates the number of pairs included in the predetermined number of pairs, which meet the condition that the difference (T1−Tref) that is obtained by subtracting the second temperature sample value (Tref) from the first temperature sample value (T1) exceeds the reference value K higher than the threshold value TH1. If the calculated number of pairs exceeds a specified reference number, the performance determination module 413 determines that the performance of the heat radiation module 20 has lowered.

The monitoring process by the performance determination module 413 is executed each time the temperature detection module 411 detects that the temperature difference (T1−Tref) exceeds the threshold value TH1 during the normal operation of the computer 10.

The temperature data storing process module 414 stores pairs of first temperature sample values and second temperature sample values, which are acquired by the performance determination module 413 each time the monitoring process is executed, in a database 500 as one set of temperature data. The database 500 is a storage device which is provided in the computer 10. As the number of days, which have passed since the user purchased the computer 10, increases, the number of sets of temperature data accumulated in the database 500 increases. After a plurality of sets of temperature data are stored in the database 500, the fault symptom detection module 415 reads out these sets of temperature data from the database 500. Then, the fault symptom detection module 415 analyzes the read-out plural sets of temperature data, and detects a symptom relating to a fault of the heat radiation module 20, from the tendency of temperature variation of the heating device 21, which is indicated by the plural sets of temperature data. For example, the fault symptom detection module 415 comprehends the tendency of the lowering of the performance of the heat radiation module 20, from the plural sets of temperature data accumulated in the database 500, and detects the presence/absence of the symptom of a fault of the heat radiation module 20. In this case, it is possible to predict when in the future a fault may possibly occur in the heat radiation module 20.

Figure 4:
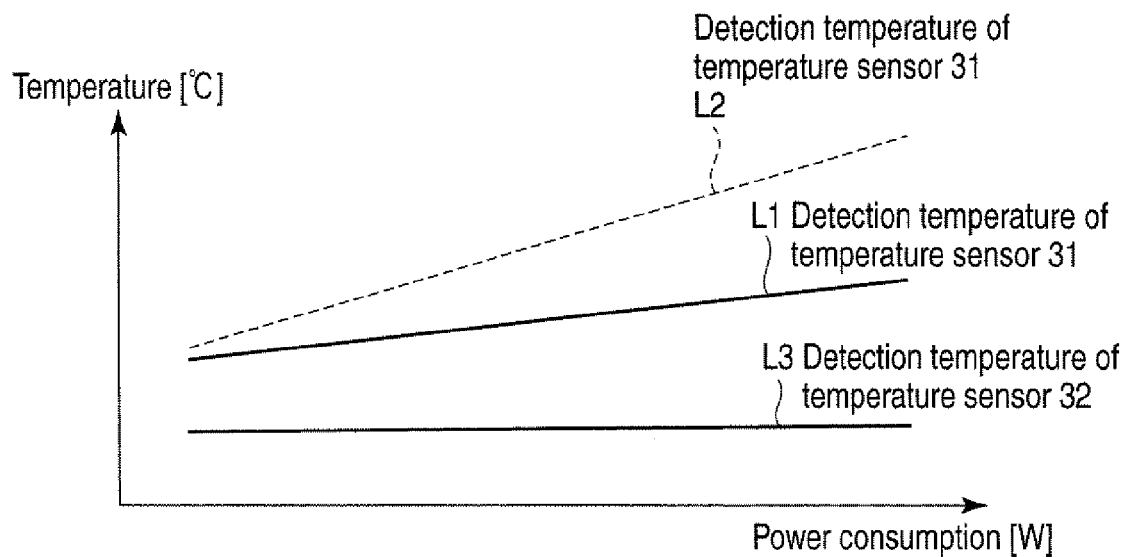
FIG. 4 is an exemplary view showing the relationship between the power consumption of the information processing apparatus according to the first embodiment, on the one hand, and the temperature of a heating device and the temperature within the casing, on the other hand.

FIG. 4 shows the relationship between the power consumption of the computer 10, on the one hand, and the board temperature near the heating device and the intra-housing temperature, on the other hand.

As the load of the heating device 21 becomes greater and the power consumption thereof increases, the power consumption of the computer 10 increases accordingly. Specifically, as the load of the heating device 21 becomes greater and the power consumption thereof increases, the detection temperature of the temperature sensor 31 (i.e. the board temperature near the heating device) increases accordingly. On the other hand, the detection temperature of the temperature sensor 32 (i.e. the intra-housing temperature) hardly increases even if the power consumption of the heating device 21 increases. In FIG. 4, a solid line L1 indicates the relationship between the power consumption and the detection temperature of the temperature sensor 31 in the case where the heat radiation module 20 normally operates. A broken line L2 indicates the relationship between the power consumption and the detection temperature of the temperature sensor 31 in the case where the performance of the heat radiation module 20 has lowered. In the case where the performance of the heat radiation module 20 has lowered (for example, in the case where the performance of the fan has lowered, or a problem has occurred in the heat pipe), the inclination of the temperature rise increases, as indicated by the broken line L2. A solid line L3 indicates the relationship between the power consumption and the detection temperature of the temperature sensor 32.

Figure 5:
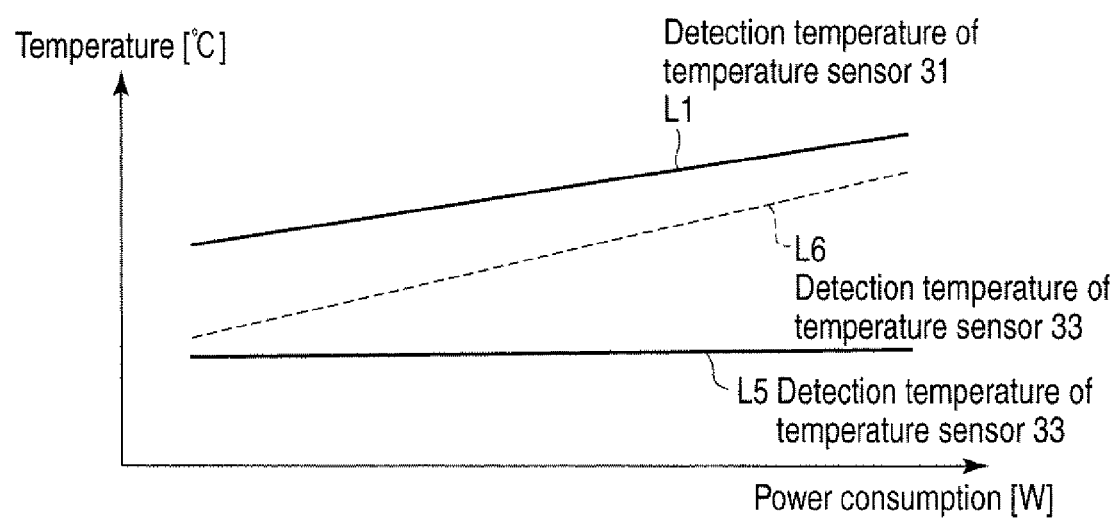
FIG. 5 is an exemplary view showing the relationship between the power consumption of the information processing apparatus according to the first embodiment and the temperature of cooling air.

FIG. 5 shows the relationship between the power consumption of the computer 10 and the temperature of cooling air.

At a normal time, the detection temperature of the temperature sensor 33 (the temperature of the cooling air) hardly varies even if the power consumption varies, as indicated by a solid line L5. However, if the air inlet port 19 is closed due to accumulation of dust or clogging of the air inlet portion 19, the air in the housing 11 is not properly exhausted and hence the detection temperature of the temperature sensor 33 rises, as indicated by a broken line L6.

Thus, not only when the temperature difference (T1−Tref) between the detection temperature (T1) of the temperature sensor 31 and the detection temperature (Tref) of the temperature sensor 32 has exceeded the threshold TH1, but also when the temperature difference (T2−Tref) between the detection temperature (T2) of the temperature sensor 33 and the detection temperature (Tref) of the temperature sensor 32 has exceeded the threshold TH2, the above-described monitoring process may be started with this timing being a trigger.

Next, referring to FIG. 6, the system configuration of the computer 10 is described.

The computer 10 comprises a CPU 111, a north bridge 112, a main memory 113, a display controller 114, a south bridge 115, a hard disk drive (HDD) 116, a network controller 117, a flash BIOS-ROM 118, an embedded controller/keyboard controller IC (EC/KBC) 119, and a power supply controller 120.

The CPU 111 is a processor which controls the operation of the respective components of the computer 10. The CPU 111 executes an operating system and various application programs/utility programs, which are loaded from the HDD 116 into the main memory 113. In addition, the CPU 111 executes a system BIOS (Basic Input/Output System) that is stored in the flash BIOS-ROM 118. The system BIOS is a program for hardware control.

The north bridge 112 is a bridge device which connects a local bus of the CPU 111 and the south bridge 115. The north bridge 112 has a function of executing communication with the display controller 114 via, e.g. an AGP (Accelerated Graphics Port) bus. In addition, the north bridge 112 includes a memory controller which access-controls the main memory 113.

The display controller 114 controls the LCD 17 which is used as a display monitor of the computer 10. The display controller 114 has a rendering arithmetic function, and the display controller 114 functions as a graphics accelerator. The south bridge 115 is connected to a PCI (Peripheral Component Interconnect) bus and to an LPC (Low Pin Count) bus.

The embedded controller/keyboard controller IC (EC/KBC) 119 is a 1-chip microcomputer in which an embedded controller for power management and a keyboard controller for controlling the keyboard (KB) 13 and touch pad 16 are integrated. The embedded controller/keyboard controller IC 119 cooperates with the power supply controller 120 to power on/off the computer 10 in response to the user's operation of the power button switch 14. The power supply controller 120 generates system power, which is to be supplied to the respective components of the computer 10, by using a battery 121 or an external power which is supplied via an AC adapter 122.

In the system of FIG. 6, for instance, the CPU 111, display controller 114, north bridge 112 or HDD 116 is heating device.

Figure 7:
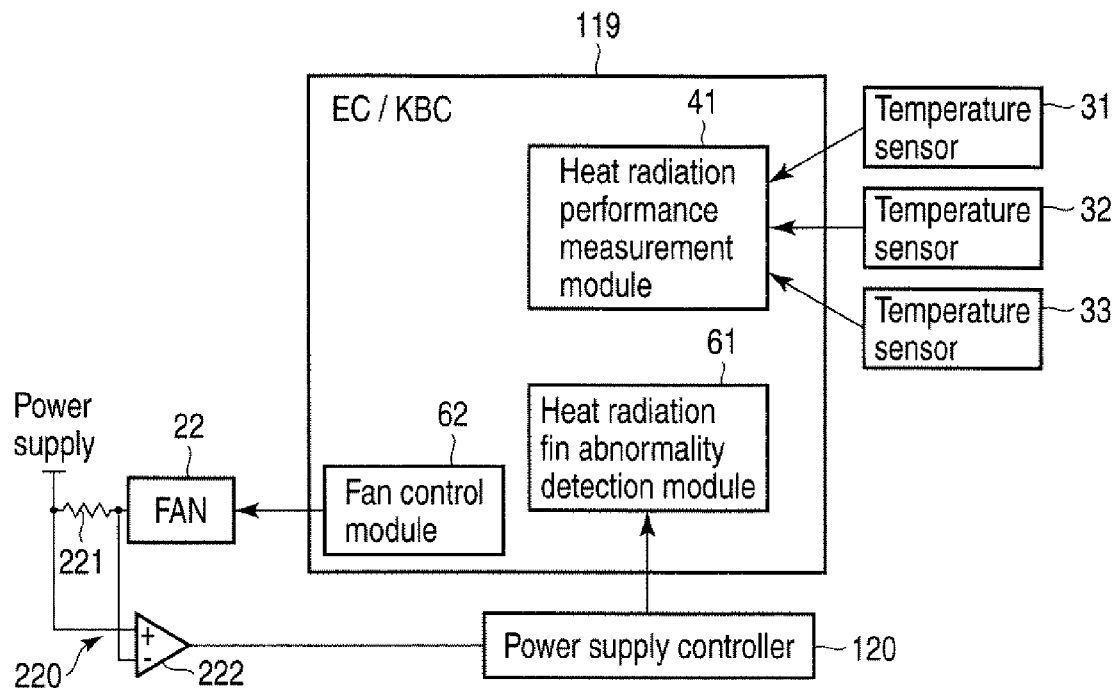
FIG. 7 is an exemplary block diagram showing a structure example of a cooling mechanism which is applied to the system configuration shown in FIG. 6.

Next, referring to FIG. 7, an example of a cooling mechanism, which is applied to the system of FIG. 6, is described.

The above-described heat radiation performance measurement module 41 may be provided, for example, in the EC/KBC 119. In the EC/KBC 119, a heat radiation fin abnormality detection module 61 and a fan control module 62 are also provided.

A resistor 221 and an operational amplifier 222 function as a power supply current detection module 220 which detects a power supply current (fan current) that is supplied to the fan 22. If clogging occurs in the heat radiation fin 23, air does not flow and the resistance of the fan 22 decreases. As a result, if clogging occurs, the value of the power supply current corresponding to a certain fan rotation number decreases. The value of the power supply current, which is detected by the power supply current detection module 220, is supplied to the heat radiation fin abnormality detection module 61 via the power supply controller 120.

The heat radiation fin abnormality detection module 61 detects clogging of the heat radiation fin 23, on the basis of the relationship between the present rotation number (present rotation speed) of the fan 22 and the value of the power supply current which is detected by the power supply current detection module 220. The heat radiation fin abnormality detection module 61 acquires the rotation number of the fan 22, for example, from the fan control module 62. The fan control module 62 controls the rotation number of the fan 22. The control of the rotation number of the fan 22 is executed, for example, in accordance with the temperature that is detected by the temperature sensor 31. As the temperature that is detected by the temperature sensor 31 becomes higher, the rotation number of the fan 22 is increased. The fan control module 62 may also detect the rotation number of the fan 22 in accordance with a rotation number signal which is output from the fan 22. The rotation number signal is, for instance, a pulse signal. Two pulse signals per rotation of the fan 22, for example, are output as the rotation number signal from the fan 22.

Parts of the functions of the above-described heat radiation measurement module 41 may be realized by a program which is executed by the CPU 111.

Figure 8:
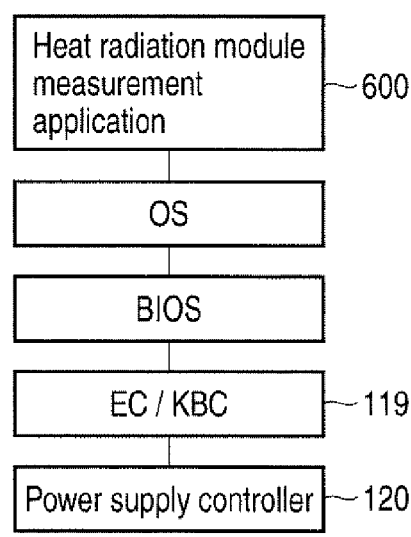
FIG. 8 is an exemplary block diagram showing the relationship between hardware and software, which corresponds to the case in which parts of the functions of the heat radiation performance measurement module shown in FIG. 3 are realized by software.

FIG. 8 shows the relationship between hardware and software, which corresponds to the case in which parts of the functions of the heat radiation performance measurement module 41 are realized by a program.

The power supply current value of the fan 22 is sent from the power supply controller 120 to the EC/KBC 119. The EC/KBC 119 is provided with, for example, the temperature difference detection module 411 shown in FIG. 3. When the temperature difference (T1−Tref) exceeds the threshold value, the EC/KBC 119 generates an event for starting the monitoring process. This event is delivered to a heat radiation module measurement application program 600 via the BIOS and OS. This heat radiation module measurement application program 600 has functions corresponding to the temperature data acquisition module 412, performance determination module 413, temperature data storing process module 414 and fault symptom detection module 415, which are shown in FIG. 3.

Figure 9:
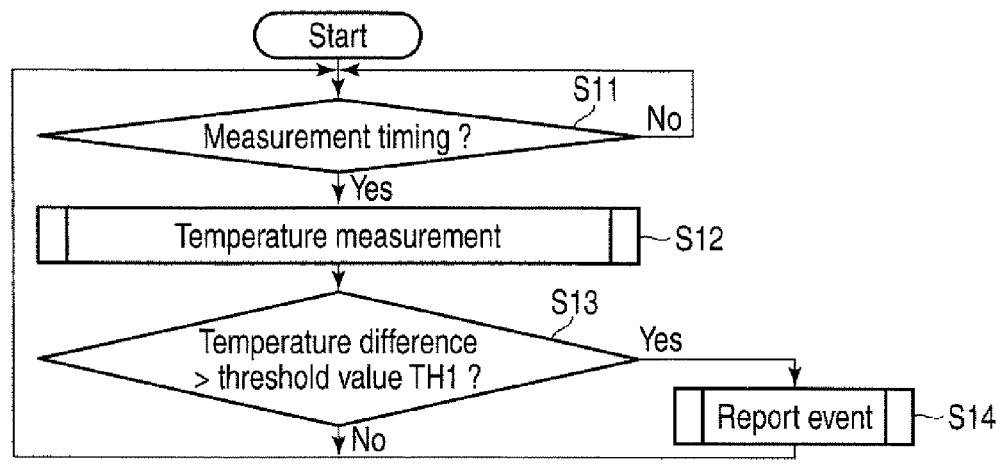
FIG. 9 is an exemplary flow chart illustrating the procedure of a temperature difference detection process which is executed by the information processing apparatus according to the first embodiment.

Next, referring to a flow chart of FIG. 9, a description is given of the procedure of a temperature difference detection process which is executed by the EC/KBC 119.

The temperature difference detection module 411 in the EC/KBC 119 executes the following process during the time period in which the computer 10 is in the power-on state. Specifically, the EC/KBC 119 executes a temperature measurement process for acquiring detection temperatures from the temperature sensors 31, 32 and 33 at predetermined time intervals (block S11, S12). The EC/KBC 119 calculates a temperature difference (T1−Tref) which is obtained by subtracting the temperature Tref, which is detected by the temperature sensor 32, from the temperature T1 which is detected by the temperature sensor 31. The EC/KBC 119 determines whether the temperature difference (T1−Tref) exceeds a threshold TH1 (block S13).

If the temperature difference (T1−Tref) exceeds the threshold TH1 (YES in block S13), the EC/KBC 119 generates an event for instructing the start of the monitoring process, thereby instructing the heat radiation module measurement application program 600 to start the monitoring process (block S14). In block S14, for example, the EC/KBC 119 generates an interrupt signal to the CPU 111, thereby reporting the occurrence of the event to the heat radiation module measurement application program 600 via the BIOS and OS.

In block S13, the EC/KBC 119 may calculate a temperature difference (T2−Tref) which is obtained by subtracting the temperature Tref, which is detected by the temperature sensor 32, from the temperature T2 which is detected by the temperature sensor 33, and may determine whether the temperature difference (T2−Tref) exceeds a certain threshold TH2. Also in the case where the temperature difference (T2−Tref) exceeds the threshold TH2, the EC/KBC 119 may generate an event for instructing the start of the monitoring process, thereby instructing the heat radiation module measurement application program 600 to start the monitoring process (block S14).

Figure 10:
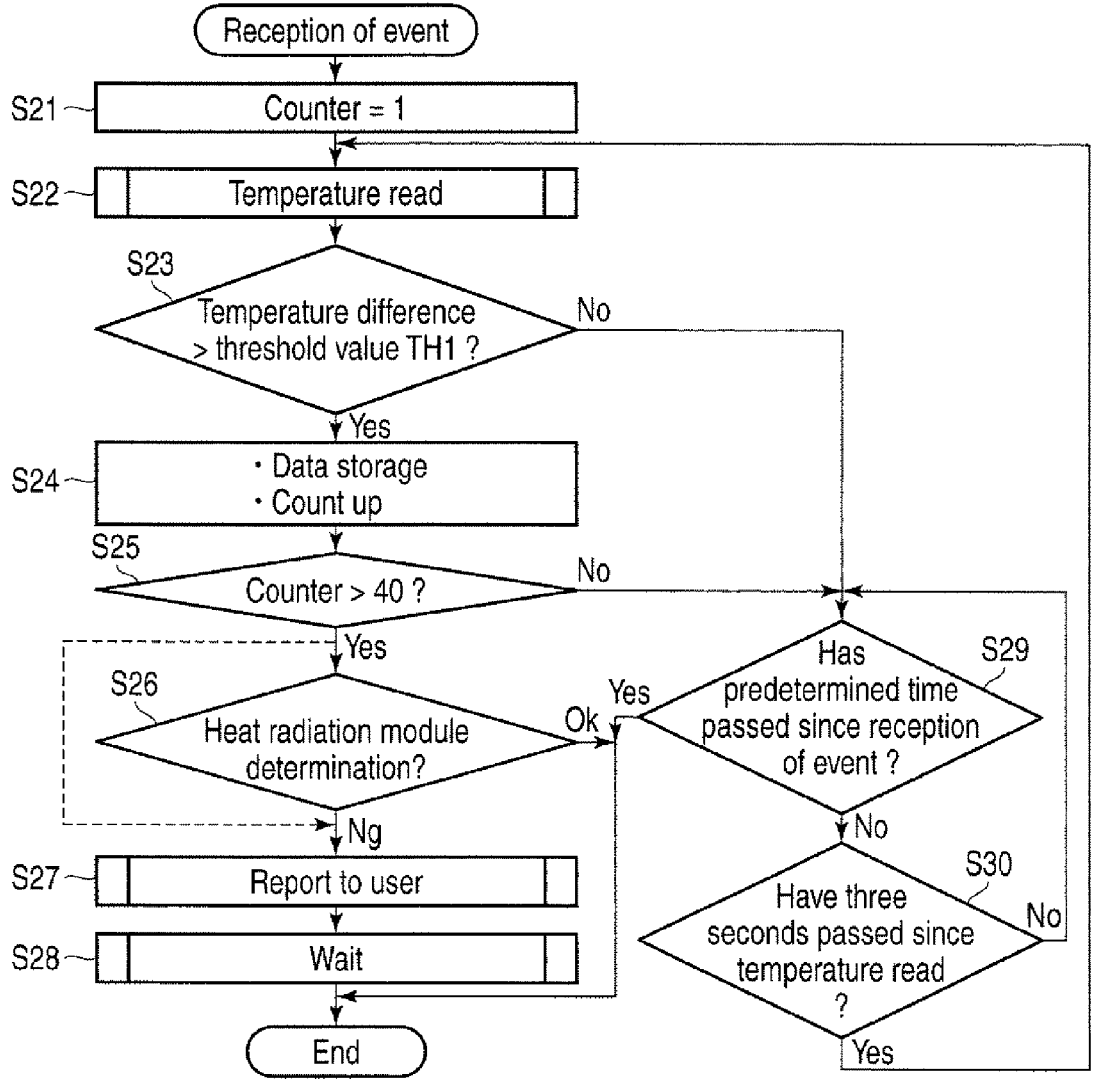
FIG. 10 is an exemplary flow chart illustrating the procedure of a monitoring process which is executed by the information processing apparatus according to the first embodiment.

Next, referring to a flow chart of FIG. 10, a description is given of the procedure of the monitoring process which is executed by the heat radiation module measurement application program 600.

The heat radiation module measurement application program 600 starts the following process, upon receiving the above-described event. At first, the outline of the monitoring process is explained.

Upon receiving the event from the EC/KBC 119, the heat radiation module measurement application program 600 reads from the EC/KBC 119 a pair (sample data) including a first temperature sample value that is indicative of the temperature which is detected by the temperature sensor 31, and a second temperature sample value that is indicative of the temperature which is detected by the temperature sensor 32. In the meantime, not only the pair of the first temperature sample value and second temperature sample value, but also a third temperature sample value that is indicative of the temperature detected by the temperature sensor 33 may be read together. In the description below, exemplification is made of the case in which the pair of the first temperature sample value and second temperature sample value is read as sample data.

This sample data read process is repeatedly executed at predetermined time intervals (e.g. in every 3 seconds). The sample data read process is repeated until 40 sample data (40 pairs of sample values) are collected. Thus, during the period (monitoring period) of at least 120 seconds, the monitoring process is continued. If 40 sample data are collected, the heat radiation module measurement application program 600 determines whether the performance of the heat radiation module 20 has lowered, on the basis of the 40 sample data.

A concrete example of the monitoring process is described below.

Under the control of the heat radiation module measurement application program 600, the CPU 111 executes the following process.

To start with, the CPU 111 initializes the value of the counter, which counts the number of sample data that are acquired, to 1 (block S21). Then, the CPU 111 reads the first temperature sample value (T1) and second temperature sample value (Tref) from the EC/KBC 119 (block S22), and determines whether the temperature difference (T1−Tref) between the first temperature sample value (T1) and second temperature sample value (Tref) is greater than the threshold value TH1 (block S23).

If the temperature difference (T1−Tref) is greater than the threshold value TH1 (YES in block S23), the CPU 111 executes a process of acquiring the first temperature sample value (T1) and second temperature sample value (Tref), which have been read, as valid sample data (block S24). In block S24, the CPU 111 stores the first temperature sample value (T1) and second temperature sample value (Tref) in the memory 113, and increments the value of the counter by +1.

It the temperature difference (T1−Tref) is not greater than the threshold value TH1 (NO in block S23), the CPU 111 skips the acquisition process of block S24.

After executing the acquisition process of block S24, the CPU 111 determines whether the value of the counter exceeds 40 (block S25). If the value of the counter is not greater than 40 (NO in block S25) or if the temperature difference (T1−Tref) is not greater than the threshold value TH1 (NO in block S23), the CPU 111 determines whether a predetermined time-out period (e.g. 5 minutes) has passed since the reception of the event (block S29). If the predetermined time-out period has not passed since the reception of the event (NO in block 29), the CPU 111 stands by until a time point when the next sampling timing will come, that is, until three seconds will have passed since the previous temperature read (block S30). When three seconds have passed since the previous temperature read (YES in block S30), the CPU 111 resumes the process from block S22.

If the value of the counter exceeds 40 before the predetermined time-out period has passed since the reception of the event, that is, if 40 sample data have been acquired (YES in block S25), the CPU 111 determines whether the performance of the heat radiation module 20 has lowered or not, on the basis of the 40 sample data (i.e. 40 pairs of the first temperature sample value T1 and second temperature sample value Tref) (block S26).

Each of the 40 sample data is data that is acquired at the time when the load of the computer is high (i.e. in the period in which T1−Tref>TH1), and is used as data for examining by what degree the temperature of the heating device 21 exceeds the temperature of the housing 11.

Even if the performance of the heat radiation module 20 has lowered, the influence due to the lowering of the performance is hardly observed at a time of low load. In the present embodiment, since the performance of the heat radiation module 20 is evaluated by using the sample data that is acquired at a time of high load (i.e. in the period in which T1−Tref>TH1), the performance of the heat radiation module 20 can correctly be evaluated.

In block S26, the CPU 111 calculates, for example, the temperature difference (T1−Tref) with respect to all the pairs, and determines whether the temperature difference (T1−Tref) is greater than the reference value K. The CPU 111 determines the presence/absence of the lowering of performance of the heat radiation module 20, on the basis of, e.g. the frequency of occurrence of pairs in which the temperature difference (T1−Tref) is greater than the reference value K. Specifically, if the number of those pairs included in the 40 pairs, which meet the condition that the temperature difference (T1−Tref) exceeds the reference value K, exceeds a certain reference number, the CPU 111 determines that some fault occurs in the heat radiation module 20 and the performance of the heat radiation module 20 has lowered.

If the CPU 111 detects the lowering in performance of the heat radiation module 20 (NG in block S26), the CPU 111 executes a process of informing the user of the lowering in performance of the heat radiation module 20 (block S27). In block S27, the CPU 111 displays a message screen for informing the user of the lowering in performance of the heat radiation module 20. Specifically, the CPU executes, for example, 1) a process of displaying on the display screen of the LCD 17 a message screen which indicates that the maintenance of the heat radiation module 20 is necessary, 2) a process of displaying a message screen for guiding the procedure of maintenance of the heat radiation module 20 to the user, and 3) a process of displaying a message screen which prompts the user to start a purpose-specific checking program for the performance measurement of the heat radiation module. Besides, the CPU 111 may calculate the ratio of the current heat radiation performance to the heat radiation performance at the normal time of the heat radiation module 20, and may display the calculated ratio on the message screen.

Subsequently, the CPU 111 stands by for the user's operation on the message screen (block S28), and executes, in accordance with the user's operation, a process of closing the message screen, a process of guiding the maintenance procedure, or a process of starting the purpose-specific checking program.

As indicated by a broken line in FIG. 10, it may be determined that the performance of the heat radiation module 20 has lowered, on condition that the value of the counter becomes greater than 40 before the predetermined time-out period has passed since the reception of the event.

The description of the flow chart of FIG. 10 is directed to the case in which the pairs of the first temperature sample value and second temperature sample value are acquired as sample data. Similarly, three temperature sample values, namely, the first temperature sample value, second temperature sample value and third temperature sample value, may be acquired as sample data. The use of the third temperature sample value also makes it possible to detect the occurrence of abnormality, such as clogging, of the air inlet port.

If the aim is to detect only the abnormality such as clogging of the air inlet port, only pairs of the second temperature sample value and third temperature sample values may be acquired. In this case, the EC/KBC 119 generates an event when the temperature difference (T2−Tref) between the third temperature sample value (T2) and the second temperature sample value (Tref) has exceeded the threshold value TH2. In response to the occurrence of this event, the heat radiation module measurement application program 600 starts the monitoring process. In the monitoring process, the heat radiation module measurement application program 600 repeatedly executes, at intervals of three seconds, (1) a process of determines whether the temperature difference (T2−Tref) is greater than the threshold value TH2 and (2) a process of acquiring pairs of the third temperature sample value (T2) and the second temperature sample value (Tref) if the temperature difference (T2−Tref) is greater than the threshold value TH2. If 40 sample data are acquired during the time-out period, the heat radiation module measurement application program 600 determines the presence/absence of the clogging of the air inlet port, on the basis of the 40 sample data. As the determining method, use may be made of such a method as to determine the presence/absence of the clogging of the air inlet port in accordance with, e.g. the frequency of occurrence of pairs in which the temperature difference (T2−Tref) is greater than the reference value L. Besides, it may be determined that the air inlet port is clogged, on condition that 40 sample data are obtained before the predetermined time-out period has passed since the reception of the event.

Figure 11:
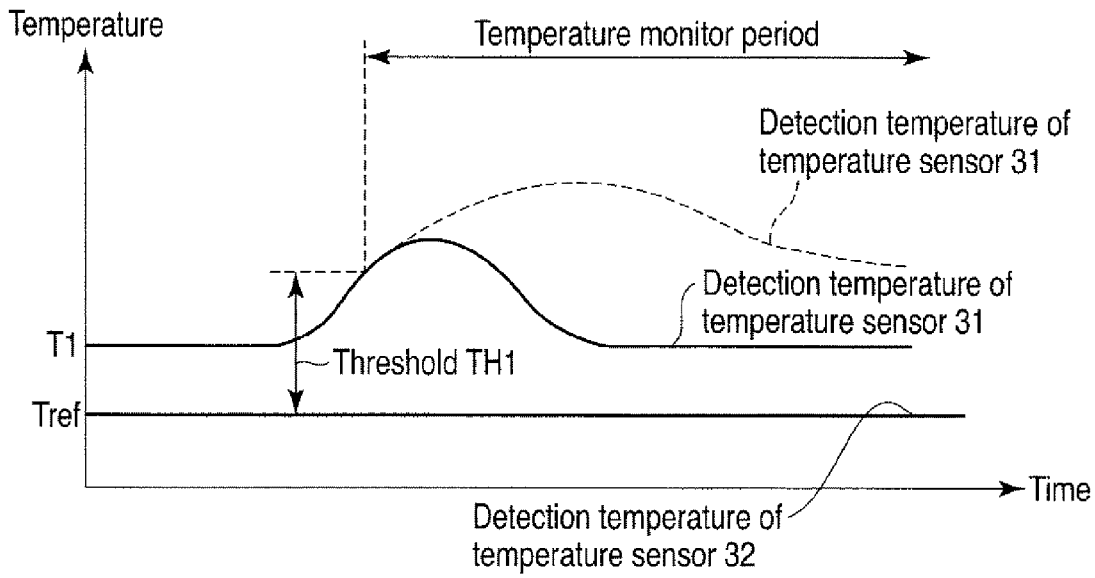
FIG. 11 is an exemplary view showing an example of the temperature variation of the heating device which is provided in the information processing apparatus according to the first embodiment.

FIG. 11 shows an example of the temperature variation of the heating device 21 at a time when a load variation occurs.

If the load of the heating device 21 sharply increases, the detection temperature of the temperature sensor 31 (the board temperature in the vicinity of the heating device 21) sharply increases accordingly. When the temperature difference (T1−Tref) exceeds the threshold value TH1, the heat radiation module measurement application program 600 starts the monitoring process in response to the event from the EC/KBC 119.

In the case where the heat radiation module 20 normally operates, high-temperature air is exhausted to the outside by the function of the heat radiation module 20. Thus, the detection temperature of the temperature sensor 31 (the board temperature near the heating device 21) lowers and falls within a steady temperature range.

As described above, even if the performance of the heat radiation module 20 is normal, there is a case in which the temperature difference (T1−Tref) temporarily exceeds the threshold value TH1 due to a variation in load of the heating device 21.

In the case where the performance of the heat radiation module 20 lowers, a great deal of time is needed to exhaust high-temperature air to the outside, owing to the deficiency of the heat radiation performance of the heat radiation module 20. Hence, once the temperature difference (T1−Tref) exceeds the threshold value TH1 due to the increase in load of the heating device 21, the detection temperature of the temperature sensor 31 (the temperature of the heating device 21) does not easily lower, as indicated by a broken line in FIG. 11.

In the present embodiment, the temperature difference (T1−Tref) is continuously monitored during the predetermined period from the time point when the temperature difference (T1−Tref) has exceeded the threshold value TH1. Therefore, such a temperature variation, that the temperature difference (T1−Tref) temporarily exceeds the threshold value TH1, can be prevented from being erroneously determined as the lowering of the performance of the heat radiation module 20.

In the computer, the variation of the load of the heating device 21 occurs frequently. Thus, such a phenomenon may successively occur that the temperature difference (T1−Tref) temporarily exceeds the threshold value TH1, despite the performance of the heat radiation module 20 being normal.

In the present embodiment, the performance of the heat radiation module 20 is determined on the basis of the number of pairs in which the temperature difference (T1−Tref) exceeds the reference value K (K>TH1). Therefore, even if such a phenomenon successively occurs that the temperature difference (T1−Tref) temporarily exceeds the threshold value TH1, it is possible to prevent this phenomenon from being erroneously determined as the lowering of the performance of the heat radiation module 20.

Figure 12:
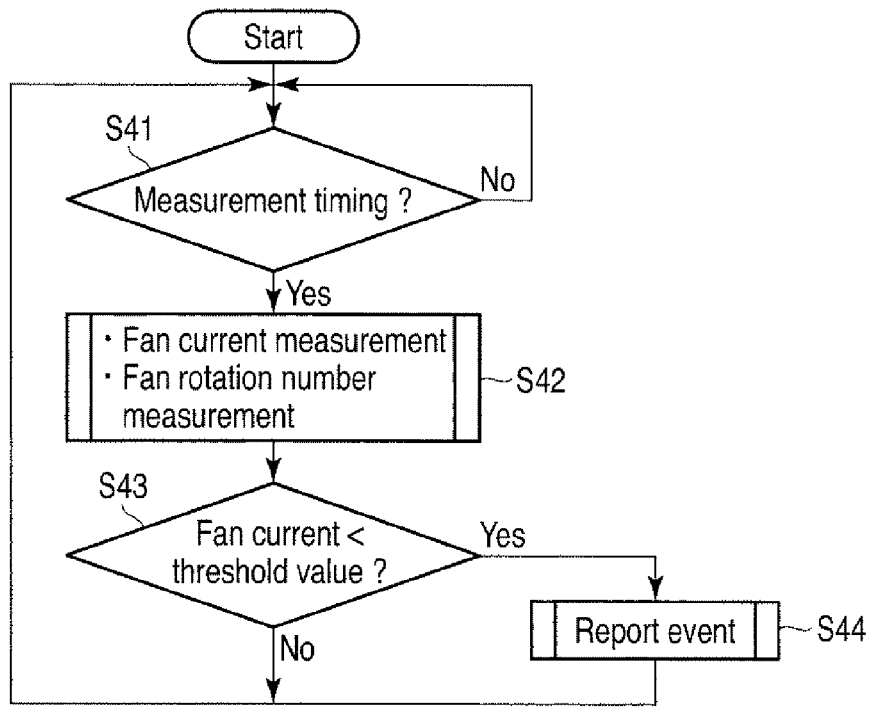
FIG. 12 is an exemplary flow chart showing the procedure of a fan current measuring process which is executed by the information processing apparatus according to the first embodiment.

Next, referring to a flow chart of FIG. 12, a description is given of the procedure of a fan current measuring process which is executed by the EC/KBC 119.

The EC/KBC 119 executes the fan current measuring process as illustrated in FIG. 12, in parallel with the temperature difference detection process illustrated in FIG. 9.

The heat radiation fin abnormality detection module 61 within the EC/KBC 119 executes the following process during the power-on state of the computer 10. Specifically, the EC/KBC 119 executes, at predetermined time intervals, a process of acquiring a fan current value which is detected by the power supply current detection module 220, and a rotation number of the fan 22 (block S41, S42). The EC/KBC 119 determines whether the fan current value, which is detected by the power supply current detection module 220, is smaller than a predetermined threshold value (block S43). As this threshold value, use may be made of, for example, a value corresponding to the present rotation number of the fan 22.

If the fan current value is smaller than the predetermined threshold value (YES in block S43), the EC/KBC 119 generates an event for instructing the start of the monitoring process, and instructs the heat radiation module measurement application program 600 to start the monitoring process (block S44). In block S44, for example, the EC/KBC 119 generates an interrupt signal to the CPU 111, thereby reporting the occurrence of the event (hereinafter referred to as "event #2") to the heat radiation module measurement application program 600 via the BIOS and OS.

Figure 13:
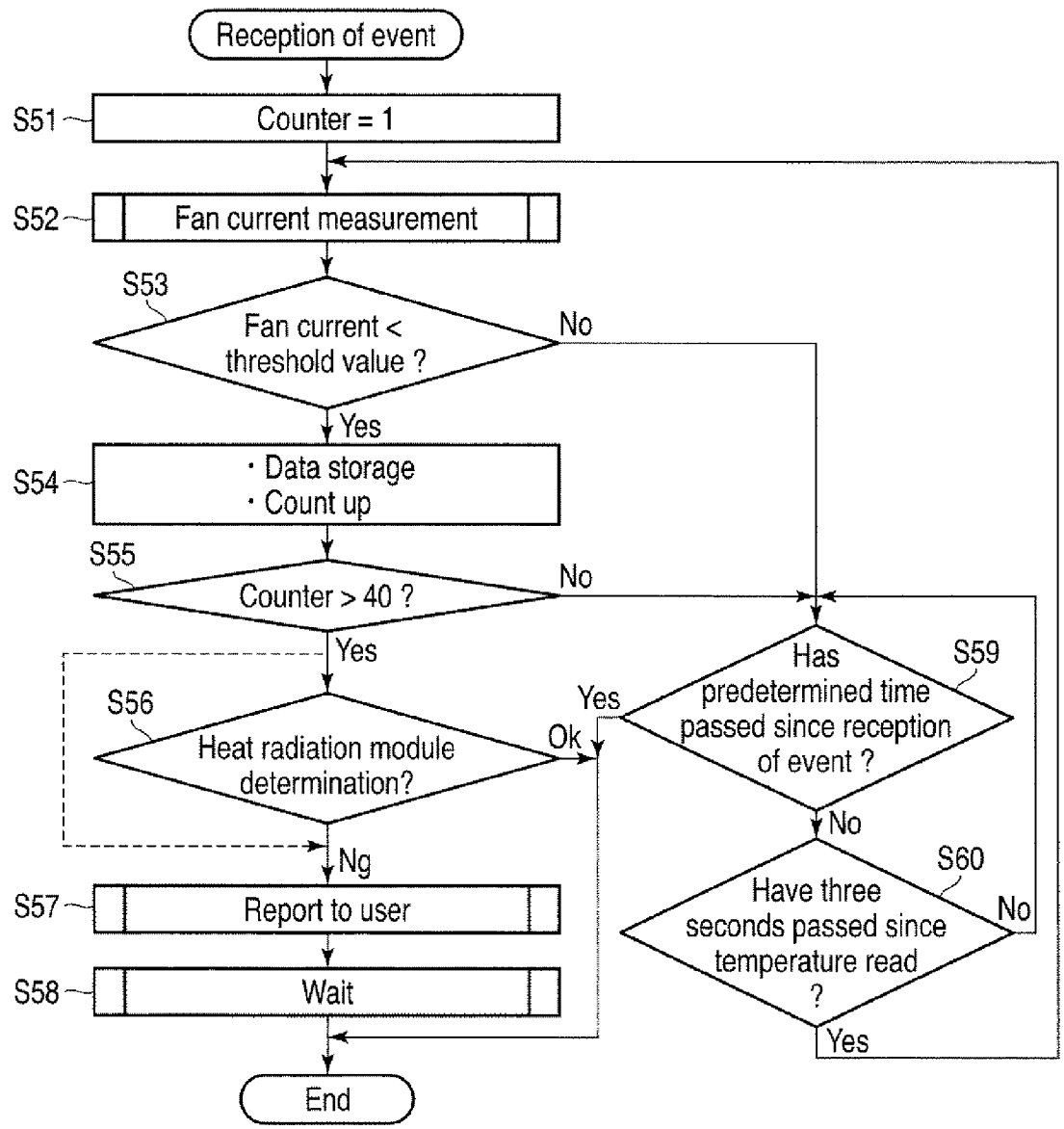
FIG. 13 is an exemplary flow chart showing the procedure of a fan current monitoring process which is executed by the information processing apparatus according to the first embodiment.

Next, referring to a flow chart of FIG. 13, a description is given of the procedure of a fan current monitoring process which is executed by the heat radiation module measurement application program 600.

The heat radiation module measurement application program 600 starts the following process, upon receiving the above-described event #2.

To start with, the CPU 111 initializes to 1 the value of the counter for counting the number of sample data that are acquired (block S51). Then, the heat radiation module measurement application program 600 reads the fan current value from the EC/KBC 119 (block S52), and determines whether the fan current value is smaller than the threshold value (block S53).

If the fan current value is smaller than the threshold value (YES in block S53), the CPU 111 executes a process of acquiring the fan current value, which has been read, as valid sample data (block S54). In block S54, the CPU 111 stores the sample data (fan current value) in the memory 113, and increments the value of the counter by +1.

If the fan current value is not smaller than the threshold value (NO in block S53), the CPU 111 skips the acquisition process of block S54.

After executing the acquisition process of block S54, the CPU 111 determines whether the value of the counter exceeds 40 (block S55). If the value of the counter is not greater than 40 (NO in block S55) or if the fan current value is not smaller than the threshold value (NO in block S53), the CPU 111 determines whether a predetermined time-out period (e.g. 5 minutes) has passed since the reception of the event #2 (block S59). If the predetermined time-out period has not passed since the reception of the event #2 (NO in block S59), the CPU 111 stands by until a time point when the next sampling timing will come, that is, until three seconds will have passed since the previous fan current read (block S60). When three seconds have passed since the previous fan current read (YES in block S60), the CPU 111 resumes the process from block S52.

If the value of the counter exceeds 40 before the predetermined time-out period has passed since the reception of the event #2, that is, if 40 sample data have been acquired (YES in block S55), the CPU 111 determines whether clogging occurs in the heat radiation fin 23, on the basis of the 40 sample data (block S56).

In block S56, the CPU 111 determines whether clogging occurs in the heat radiation fin 23, on the basis of, e.g. the frequency of occurrence of sample data in which the fan current is smaller than a specified reference value.

Specifically, if the number of those sample data included in the 40 sample data, in which the fan current is smaller than the reference value, exceeds a certain reference number, the CPU 111 determines that clogging occurs in the heat radiation fin 23.

If the CPU 111 detects the clogging of the heat radiation fin 23 (NG in block S56), the CPU 111 executes a process of informing the user of the clogging of the heat radiation fin 23 (block S57). In block S57, the CPU 111 displays a message screen for informing the user of the clogging of the heat radiation fin 23. Specifically, the CPU executes, for example, 1) a process of displaying on the display screen of the LCD 17 a message screen which indicates that the maintenance of the heat radiation fin 23 is necessary, 2) a process of displaying a message screen for guiding the procedure of maintenance of the heat radiation fin 23 to the user, and 3) a process of displaying a message screen which prompts the user to start a purpose-specific checking program for the performance measurement of the heat radiation module.

Subsequently, the CPU 111 stands by for the user's operation on the message screen (block S58), and executes, in accordance with the user's operation, a process of closing the message screen, a process of guiding the maintenance procedure, or a process of starting the purpose-specific checking program.

As indicated by a broken line in FIG. 13, it may be determined that clogging has occurred in the heat radiation fin 23, on condition that the value of the counter becomes greater than 40 before the predetermined time-out period has passed since the reception of the event #2.

As has been described above, in the present first embodiment, by using as a trigger the occurrence of the event that the temperature difference between the temperature of the heating device and the intra-housing temperature exceeds the threshold value, the process of monitoring the temperature difference between the temperature of the heating device and the intra-housing temperature is executed continuously during the predetermined time period. By this monitoring process, a temporary increase of the load can be prevented from being erroneously determined as the lowering of the performance of the heat radiation module.

Second Embodiment

Next, another example of arrangement of a plurality of temperature sensors, which are applied to the computer 10, will be described as a second embodiment of the present invention. In the description below, only parts different from the first embodiment are mainly described.

FIG. 14 shows the positional relationship between a cooling mechanism which is provided in the housing 11, and a plurality of temperature sensors. As shown in FIG. 14, a heat radiation module 20, a heating device 21, and temperature sensors 71, 72 and 73 are provided in the housing 11.

An air outlet port 18 is provided in one side wall of the housing 11. In addition, an air inlet port 19 is provided, for example, in another side wall of the housing 11.

The temperature sensors 71 to 73 are provided on the printed circuit board 111. Each of the temperature sensors 71 to 73 is composed of, for instance, a thermistor or a dedicated temperature sensor IC, which is attached on the printed circuit board 111.

The temperature sensor 71, like the above-described temperature sensor 31, functions as a sensor for detecting a temperature rise due to abnormality of the heat radiation module 20. While the temperature sensor 31 detects the ambient temperature of the heating device 21, the temperature sensor 71 detects the ambient temperature of the heat radiation module 20. Specifically, the temperature sensor 71 functions as a first temperature sensor which detects the temperature at a first position on the printed circuit board 111, which is close to the heat radiation module 20 (i.e. the board temperature near the heat radiation module 20). The temperature sensor 71 is provided at the first position on the printed circuit board 111, which is close to the heat radiation module 20. When abnormality of the heat radiation module 20, such as clogging of the heat radiation fin 23, has occurred, heated air near the heat radiation fin 23 moves to the periphery of the heat radiation module 20, for example, the periphery of the fan 22. As a result, the board temperature near the heat radiation module 20 rises. The rise of the board temperature is detected by the temperature sensor 71. In short, the temperature sensor 71, like the temperature sensor 31, functions as a sensor for detecting the temperature rise due to abnormality of the heat radiation module 20.

The temperature sensor 71 may be disposed, for example, at either of a position indicated by a solid line in FIG. 14 or a position indicated by a broken line in FIG. 14. However, the first position, where the temperature sensor 71 is disposed, should preferably be a position (the position indicated by the solid line in FIG. 14) which is close to the heat radiation module 20 and is as distant as possible from the heating device 12.

The temperature sensor 72, like the above-described temperature sensor 32, functions as a second temperature sensor which detects a reference temperature. The temperature sensor 72 detects the temperature at a second position (i.e. the intra-housing temperature) on the printed circuit board 111, which is farther from each of the heating device 21 and heat radiation module 20 than the first position where the temperature sensor 71 is disposed. Specifically, the temperature sensor 72 is disposed at an end portion on the board 111 (i.e. a position indicated by a solid line or a broken line in FIG. 14) which is hardly affected by the heat that is produced by the heating device 21 and which is far from the heat radiation module 20. Specifically, the temperature sensor 72 is provided at an end position on the board 111 on the opposite side to the heat radiation module 20, with the heating device 21 being interposed between the temperature sensor 72 and the heat radiation module 20.

The temperature sensor 73 is provided at a third position on the board 111, which is located between the inlet port 19 provided in the housing 11 and the heat radiation module 20. The temperature sensor 73, like the above-described temperature sensor 33, is used as a third temperature sensor which detects the temperature at the third position on the board 111, that is, the temperature of the air (cooling air) flowing from the inlet port 19 toward the heat radiation module 20.

Figure 15:
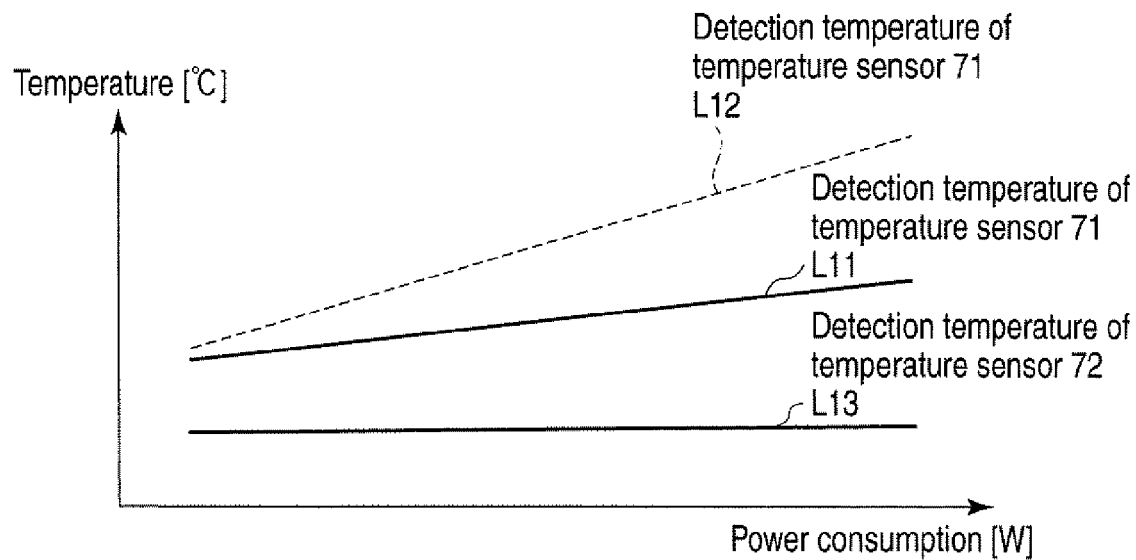
FIG. 15 is an exemplary view for explaining variations of temperatures which are detected by the first and second temperature sensors shown in FIG. 14.

FIG. 15 shows the relationship between the power consumption of the computer 10, and the board temperature in the vicinity of the heat radiation module and the intra-housing temperature.

In FIG. 15, a solid line L11 indicates the relationship between the power consumption and the detection temperature of the temperature sensor 71 in the case where the heat radiation module 20 normally operates. A broken line L12 indicates the relationship between the power consumption and the detection temperature of the temperature sensor 71 in the case where the performance of the heat radiation module 20 has lowered. In the case where the performance of the heat radiation module 20 has lowered (for example, in the case where the performance of the fan has lowered, or clogging has occurred in the heat radiation fin), the inclination of the rise of the temperature detected by the temperature sensor 71 increases, as indicated by the broken line L12. A solid line L13 indicates the relationship between the power consumption and the detection temperature of the temperature sensor 72. The detection temperature (intra-housing temperature) of the temperature sensor 72 is hardly influenced by the increase in power consumption of the heating device 21 or the lowering in performance of the heat radiation module 20.

Figure 16:
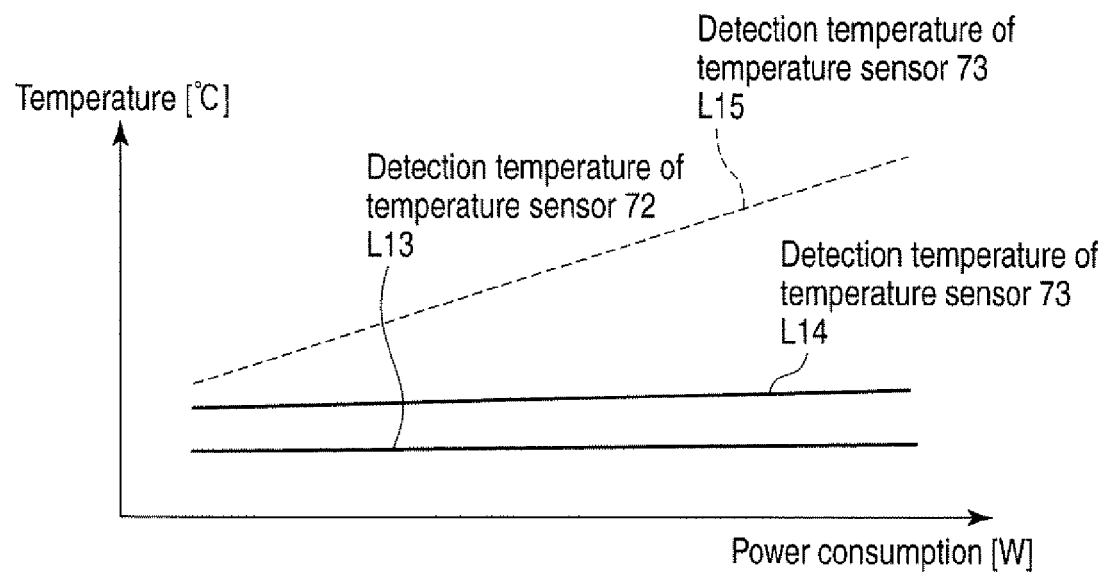
FIG. 16 is an exemplary view for explaining variations of temperatures which are detected by the second and third temperature sensors shown in FIG. 14.

FIG. 16 shows the relationship between the power consumption of the computer 10, and the temperature of cooling air and the intra-housing temperature.

In FIG. 16, a solid line L14 indicates the relationship between the power consumption and the detection temperature of the temperature sensor 73 in the case where the heat radiation module 20 normally operates. A broken line L15 indicates the relationship between the power consumption and the detection temperature of the temperature sensor 73 in the case where the performance of the heat radiation module 20 has lowered. In the case where the performance of the heat radiation module 20 has lowered (for example, in the case where clogging has occurred in the heat radiation fin), the exhaust of air from the air outlet port 18 to the outside becomes unsmooth, and accordingly the suction of air from the air inlet port 19 becomes unsmooth. As a result, the temperature in the vicinity of the air inlet port 19 rises. Hence, the temperature detected by the temperature sensor 73 increases, as indicated by the broken line L15.

Figure 17:
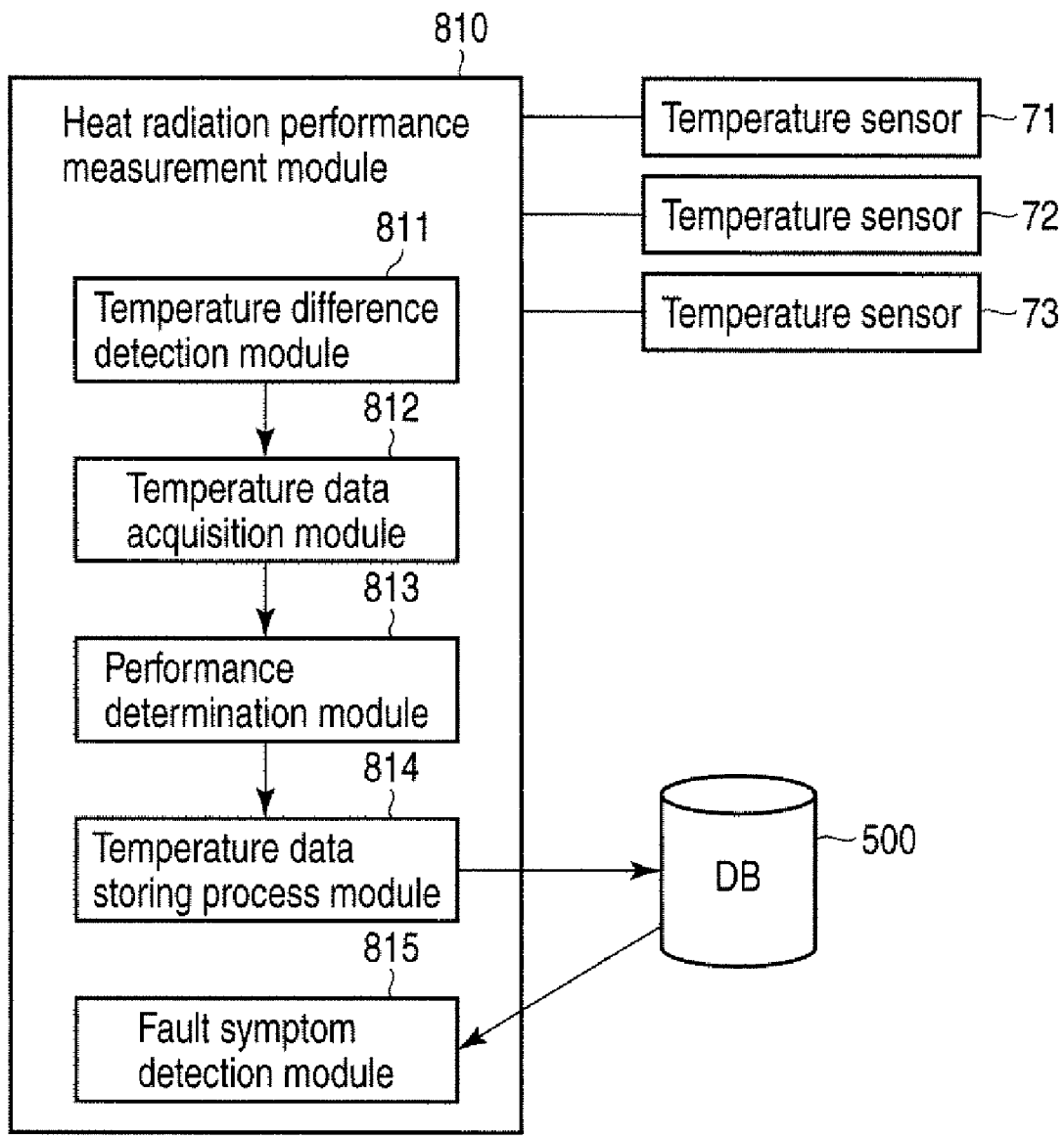
FIG. 17 is an exemplary block diagram showing a structure example of a heat radiation performance measurement module which is used in the second embodiment.

FIG. 17 shows the structure of a heat radiation performance measurement module 810 which is provided in the computer 10 according to the second embodiment.

The heat radiation performance measurement module 810 measures the performance of the heat radiation module 20 by using all the temperature sensors 71 to 73, or by using only the temperature sensors 71 and 72 or only the temperature sensors 72 and 73.

The heat radiation performance measurement module 810 includes a temperature difference detection module 811, a temperature data acquisition module 812, a performance determination module 813, a temperature data storing process module 814 and a fault symptom detection module 815.

The temperature difference detection module 811 detects a temperature difference (T1−Tref) which is obtained by subtracting the temperature (Tref), which is detected by the temperature sensor 72, from the temperature (T1) which is detected by the temperature sensor 71. In addition, the temperature difference detection module 811 detects a temperature difference (T2−Tref) which is obtained by subtracting the temperature (Tref), which is detected by the temperature sensor 72, from the temperature (T2) which is detected by the temperature sensor 73.

The performance determination module 813 is activated when the temperature difference (T1−Tref), which is detected by the temperature difference detection module 811, exceeds a certain specific threshold value TH11, or when the temperature difference (T2−Tref), which is detected by the temperature difference detection module 811, exceeds a certain specific threshold value TH12. The performance determination module 813 continuously executes, during a predetermined time period from the time point when the temperature difference (T1−Tref) exceeds the threshold value TH1, a monitoring process of monitoring the temperature difference (T1−Tref) between the temperature (T1) that is detected by the temperature sensor 71 and the temperature (Tref) that is detected by the temperature sensor 72. On the basis of the result of this monitoring process, the performance determination module 813 determines whether the performance of the heat radiation module 20 has lowered or not. In addition, the performance determination module 813 continuously executes, during a predetermined time period from the time point when the temperature difference (T2−Tref) exceeds the threshold value TH12, a monitoring process of monitoring the temperature difference (T2−Tref) between the temperature (T2) that is detected by the temperature sensor 73 and the temperature (Tref) that is detected by the temperature sensor 72. On the basis of the result of this monitoring process, the performance determination module 813 determines whether the performance of the heat radiation module 20 has lowered or not.

In the meantime, at each of the time when the temperature difference (T1−Tref) that is detected by the temperature difference detection module 811 exceeds the threshold value TH1 and the time when the temperature difference (T2−Tref) that is detected by the temperature difference detection module 811 exceeds the threshold value TH12, the performance determination module 813 may monitor the temperatures T1, T2 and Tref for a predetermine time period, and may determine whether the performance of the heat radiation module 20 has lowered or not, by taking into account both the variation in the temperature difference (T1−Tref) during this time period and the variation in the temperature difference (T2−Tref) during this time period.

The monitoring process, which is executed by the performance determination module 813, can be executed by the same procedure as has been described with reference to the flow chart of FIG. 10.

The temperature data storing process module 814 stores temperature sample values corresponding to the temperatures T1, T2 and Tref, which are acquired by the performance determination module 813 via the temperature data acquisition module 812 each time the monitoring process is executed, in the database 500 as temperature data. The fault symptom detection module 815 analyzes the temperature data that are accumulated in the database 500, and detects a symptom relating to a fault of the heat radiation module 20.

Third Embodiment

Next, still another example of arrangement of a plurality of temperature sensors, which are applied to the computer 10, will be described as a third embodiment of the present invention. In the description below, only parts different from the first embodiment are mainly described.

FIG. 18 shows the positional relationship between a cooling mechanism which is provided in the housing 11, and a plurality of temperature sensors. As shown in FIG. 18, a heat radiation module 20, a heating device 21, and temperature sensors 81, 82 and 83 are provided in the housing 11.

An air outlet port 18 is provided in one side wall of the housing 11. In addition, an air inlet port 19 is provided, for example, in another side wall of the housing 11.

The temperature sensors 81 to 83 are provided on the printed circuit board 111. Each of the temperature sensors 81 to 83 is composed of, for instance, a thermistor or a dedicated temperature sensor IC, which is attached on the printed circuit board 111.

The temperature sensor 81, like the above-described temperature sensor 31, functions as a sensor for detecting a temperature rise due to abnormality of the heat radiation module 20. The temperature sensor 81 detects the ambient temperature of the heating device 21. Specifically, the temperature sensor 81 detects the temperature at a first position on the printed circuit board 111, which is close to the heating device 21 and is located between the heating device 21 and the radiation module 20. As shown in FIG. 18, in the case where the left side of the heating device 21 is disposed to be opposed to the heat radiation module 20, the temperature sensor 81 is disposed between the left side of the heating device 21 and the radiation module 20, and detects the board temperature in the vicinity of the left side of the heating device 21.

The temperature sensor 82, like the above-described temperature sensor 32, functions as a second temperature sensor which detects a reference temperature. The temperature sensor 82 detects the temperature at a second position (i.e. the intra-housing temperature) on the printed circuit board 111, which is farther from each of the heating device 21 and heat radiation module 20 than the first position where the temperature sensor 81 is disposed. Specifically, the temperature sensor 82 is disposed at an end portion on the board 111 (i.e. a position indicated by a solid line or a broken line in FIG. 18) which is hardly affected by the heat that is produced by the heating device 21 and which is far from the heat radiation module 20. In other words, the temperature sensor 82 is provided at an end position on the board 111 on the opposite side to the heat radiation module 20, with the heating device 21 being interposed between the temperature sensor 82 and the heat radiation module 20.

The temperature sensor 83 is used in order to detect the ambient temperature of the heating device 21. Specifically, the temperature sensor 83 detects the temperature at a third position on the printed circuit board 111 which is close to a side of the heating device 21, which is other than the side thereof that is opposed to the heat radiation module 20. In the case where the temperature sensor 81 is disposed near the left side of the heating device 21, the temperature sensor 83 is disposed, for example, near the right side or lower side of the heating device 21.

FIG. 19 shows the relationship between the power consumption of the computer 10, and the detection temperatures of the temperature sensors 81, 82 and 83.

In a graph shown in the upper part of FIG. 19, a solid line L21 indicates the relationship between the power consumption and the detection temperature of the temperature sensor 81 in the case where the heat radiation module 20 normally operates. A broken line L22 indicates the relationship between the power consumption and the detection temperature of the temperature sensor 81 in the case where the performance of the heat radiation module 20 has lowered. In the case where the performance of the heat radiation module 20 has lowered (for example, in the case where the performance of the fan has lowered, or clogging has occurred in the heat radiation fin), the inclination of the rise of the temperature detected by the temperature sensor 81 increases, as indicated by the broken line L22. A solid line L23 indicates the relationship between the power consumption and the detection temperature of the temperature sensor 82. The detection temperature (intra-housing temperature) of the temperature sensor 82 is hardly influenced by the increase in power consumption of the heating device 21 or the lowering in performance of the heat radiation module 20.

In a graph shown in the lower part of FIG. 19, a solid line L24 indicates the relationship between the power consumption and the detection temperature of the temperature sensor 83 in the case where the heat radiation module 20 normally operates. A broken line L25 indicates the relationship between the power consumption and the detection temperature of the temperature sensor 83 in the case where the performance of the heat radiation module 20 has lowered. In the case where the performance of the heat radiation module 20 has lowered (for example, in the case where the performance of the fan has lowered, or clogging has occurred in the heat radiation fin), the inclination of the rise of the temperature detected by the temperature sensor 83 increases, as indicated by the broken line L25.

As is understood from FIG. 19, if a fault, such as clogging of the heat radiation fin 23, has occurred, the heat of the heating device 21 is not easily exhausted to the outside, and both the temperature detected by the temperature sensor 81 and the temperature detected by the temperature sensor 83 increase, compared to the case in which the heat radiation module 20 normally operates.

FIG. 20 shows another example of the relationship between the power consumption of the computer 10, and the detection temperatures of the temperature sensors 81, 82 and 83.

In a graph shown in the upper part of FIG. 20, a solid line L21 indicates the relationship between the power consumption and the detection temperature of the temperature sensor 81 in the case where the heat radiation module 20 normally operates. A broken line L22 indicates the relationship between the power consumption and the detection temperature of the temperature sensor 81 in the case where there has occurred a factor other than the clogging of the heat radiation fin 23 (e.g. heat production due to a fault of a device 300 in FIG. 18). If there has occurred a factor other than the clogging of the heat radiation fin 23 (e.g. heat production due to a fault of the device 300 in FIG. 18), the detection temperature of the temperature sensor 81 rises, as indicated by the broken line L22.

In a graph shown in the lower part of FIG. 20, a solid line L24 indicates the relationship between the power consumption and the detection temperature of the temperature sensor 83 in the case where the heat radiation module 20 normally operates. A broken line L25 indicates the relationship between the power consumption and the detection temperature of the temperature sensor 83 in the case where there has occurred a factor other than the clogging of the heat radiation fin 23 (e.g. heat production due to a fault of the device 300 in FIG. 18). Even if there has occurred a factor other than the clogging of the heat radiation fin 23 (e.g. heat production due to a fault of the device 300 in FIG. 18), the detection temperature of the temperature sensor 83 hardly varies, as indicated by the broken line L25.

As is understood from FIG. 19 and FIG. 20, when a fault occurs in the heat radiation fin 23, both the detection temperatures of the temperature sensors 81 and 83 increase. On other hand, in the case of a factor other than the fault of the heat radiation fin 23, only the detection temperature of the temperature sensor 81 rises, and the detection temperature of the temperature sensor 83 hardly varies. Therefore, by monitoring the detection temperatures of the temperature sensors 81, 82 and 83, it becomes possible to determine not only the lowering of the heat radiation performance, but also the factor of the lowering of the heat radiation performance.

Figure 21:
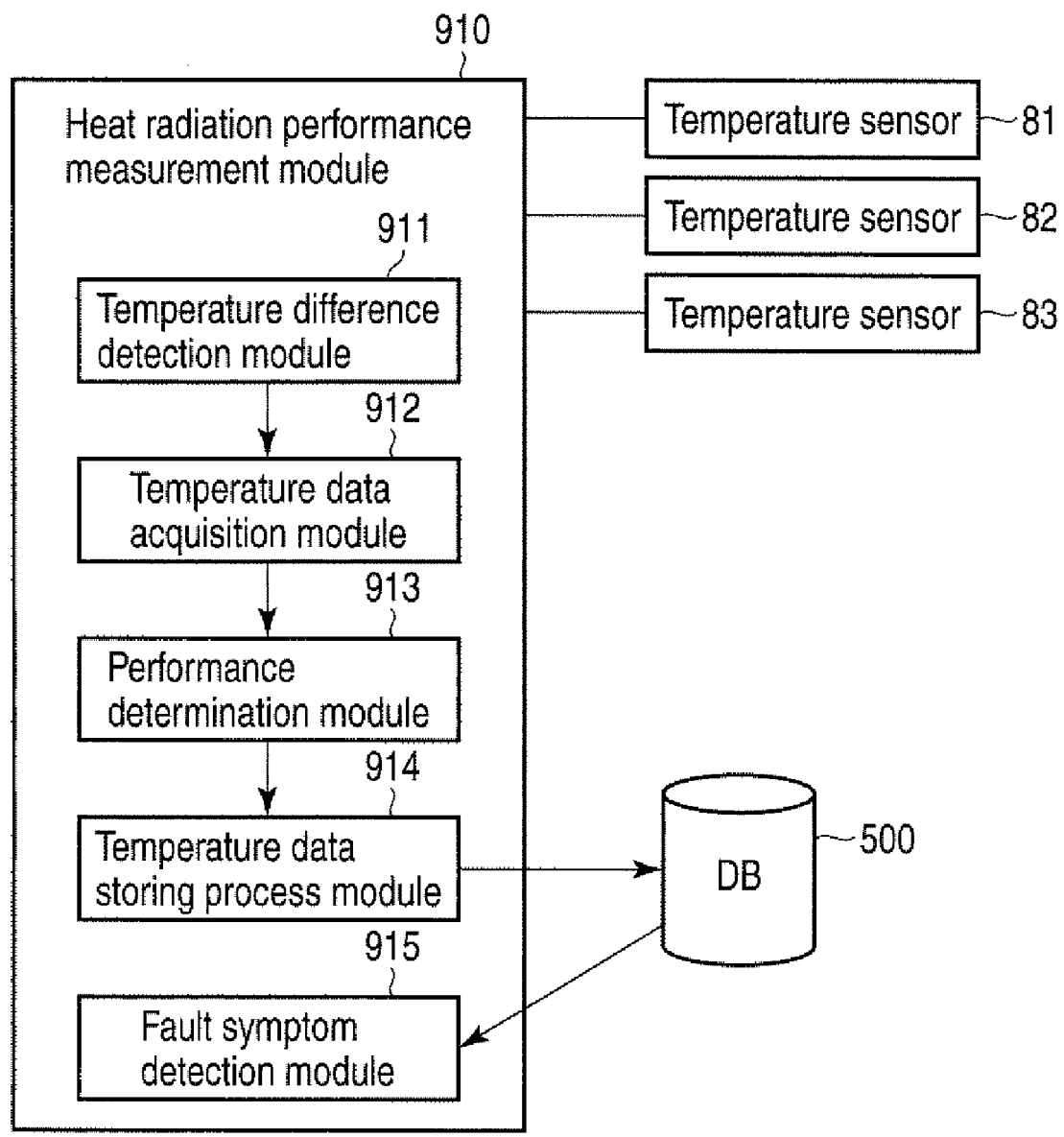
FIG. 21 is an exemplary block diagram showing a structure example of a heat radiation performance measurement module which is used in the third embodiment.

FIG. 21 shows the structure of a heat radiation performance measurement module 910 which is provided in the computer 10 according to the third embodiment.

The heat radiation performance measurement module 910 measures the performance of the heat radiation module 20 by using all the temperature sensors 81 to 83.

The heat radiation performance measurement module 910 includes a temperature difference detection module 911, a temperature data acquisition module 912, a performance determination module 913, a temperature data storing process module 914 and a fault symptom detection module 915.

The temperature difference detection module 911 detects a temperature difference (T1−Tref) which is obtained by subtracting the temperature (Tref), which is detected by the temperature sensor 82, from the temperature (T1) which is detected by the temperature sensor 81. In addition, the temperature difference detection module 911 detects a temperature difference (T2−Tref) which is obtained by subtracting the temperature (Tref), which is detected by the temperature sensor 82, from the temperature (T2) which is detected by the temperature sensor 83.

The performance determination module 913 is activated when the temperature difference (T1−Tref), which is detected by the temperature difference detection module 911, exceeds a certain specific threshold value TH11, or when the temperature difference (T2−Tref), which is detected by the temperature difference detection module 911, exceeds a certain specific threshold value TH12. The performance determination module 913 continuously executes, during a predetermined time period from the time point when the temperature difference (T1−Tref) or the temperature difference (T2−Tref) exceeds the corresponding threshold value, a monitoring process of monitoring the temperature (T1) that is detected by the temperature sensor 81, the temperature (Tref) that is detected by the temperature sensor 82, and the temperature (T2) that is detected by the temperature sensor 83. On the basis of the result of this monitoring process, the performance determination module 913 determines whether the performance of the heat radiation module 20 has lowered or not. In this monitoring process, the presence/absence of the clogging of the heat radiation fin 23 can also be determined. In the monitoring process, the performance determination module 913 acquires the detection temperatures of the temperature sensors 81, 82 and 83 via the temperature data acquisition module 912.

The monitoring process, which is executed by the performance determination module 913, can also be executed by the same procedure as has been described with reference to the flow chart of FIG. 10.

The temperature data storing process module 914 stores temperature sample values corresponding to the temperatures T1, T2 and Tref, which are acquired by the performance determination module 913 via the temperature data acquisition module 912 each time the monitoring process is executed, in the database 500 as temperature data. The fault symptom detection module 915 analyzes the temperature data that are accumulated in the database 500, and detects a symptom relating to a fault of the heat radiation module 20.

The various modules of the systems described herein can be implemented as software applications, hardware and/or software modules, or components on one or more computers, such as servers. While the various modules are illustrated separately, they may share some or all of the same underlying logic or code.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An information processing apparatus comprising:
a housing;
a printed circuit board provided in the housing;
a heating device disposed on the printed circuit board;
a heat radiation module provided in the housing, configured to exhaust heat of the heating device to outside;
a first temperature sensor provided in the housing, configured to detect a temperature at a first position on the printed circuit board, the first position being close to the heating device;
a second temperature sensor configured to detect a temperature at a second position farther from the heating device than the first position, the second position being located at an end portion of the printed circuit board, the end portion being shifted from a center position of the housing to a side wall of the housing;
a temperature difference detection module configured to detect a temperature difference which is obtained by subtracting the temperature at the second position detected by the second temperature sensor from the temperature at the first position detected by the first temperature sensor; and
a performance determination module configured to, in a case where the temperature difference exceeds a threshold value, repeatedly execute a process of acquiring a pair of a first temperature sample value indicative of the temperature at the first position detected by the first temperature sensor and a second temperature sample value indicative of the temperature at the second position detected by the second temperature sensor during a predetermined period from a time point when the temperature difference exceeds the threshold value at predetermined time intervals, and to determine whether a performance of the heat radiation module has lowered or not, based on a number of pairs of which difference that is obtained by subtracting the second temperature sample value from the first temperature sample value exceeds a reference value.

2. The information processing apparatus of claim 1, further comprising a third temperature sensor configured to detect a temperature at a third position on the printed circuit board, which is located between an air inlet port provided in the housing and the heat radiation module,
wherein the performance determination module is configured to detect clogging of the air inlet port in accordance with a temperature difference between the temperature detected by the third temperature sensor and the temperature at the second position detected by the second temperature sensor.

3. The information processing apparatus of claim 1, wherein the heat radiation module includes:
   a heat radiation fin provided at a position in the housing, which is opposed to an air outlet port provided in the housing, and thermally connected to the heating device; and
   a fan configured to cool the heat radiation fin.

4. The information processing apparatus of claim 3, further comprising:
   a power supply current detection module configured to detect a power supply current which is supplied to the fan; and
   a heat radiation fin abnormality detection module configured to detect clogging of the heat radiation fin, based on a relationship between a rotation number of the fan and the detected power supply current.

5. The information processing apparatus of claim 1, wherein the heating device is a central processing unit.

6. An information processing apparatus comprising:
   a housing;
   a printed circuit board provided in the housing;
   a heating device disposed on the printed circuit board;
   a heat radiation module provided in the housing, configured to exhaust heat of the heating device to outside;
   a first temperature sensor provided in the housing, configured to detect a temperature at a first position on the printed circuit board, the first position being close to the heating device;
   a second temperature sensor configured to detect a temperature at a second position farther from each of the heat radiation module and the heating device than the first position, the second position being located at an end portion of the printed circuit board, the end portion being shifted from a center position of the housing to a side wall of the housing;
   a temperature difference detection module configured to detect a temperature difference which is obtained by subtracting the temperature at the second position detected by the second temperature sensor from the temperature at the first position detected by the first temperature sensor; and
   a performance determination module configured to, in a case where the temperature difference exceeds a threshold value, repeatedly execute a process of acquiring a pair of a first temperature sample value indicative of the temperature at the first position detected by the first temperature sensor and a second temperature sample value indicative of the temperature at the second position detected by the second temperature sensor during a predetermined period from a time point when the temperature difference exceeds the threshold value at predetermined time intervals, and to determine whether a performance of the heat radiation module has lowered or not, based on a number of pairs of which difference that is obtained by subtracting the second temperature sample value from the first temperature sample value exceeds a reference value.

7. The information processing apparatus of claim 6, further comprising a third temperature sensor configured to detect a temperature at a third position on the printed circuit board, which is located between an air inlet port provided in the housing and the heat radiation module,
   wherein the performance determination module is configured to execute, in a case where another temperature difference which is obtained by subtracting the temperature at the second position detected by the second temperature sensor from the temperature at the third position detected by the third temperature sensor exceeds a threshold, another monitoring process of monitoring the temperature difference between the temperature at the third position and the temperature at the second position during a predetermined period from a time point when said another temperature difference exceeds a threshold value, and to determine, based on a result of said another monitoring process, whether the performance of the heat radiation module has lowered or not.

\* \* \* \* \*